United States Patent
Tamaki et al.

(10) Patent No.: US 10,083,957 B2
(45) Date of Patent: Sep. 25, 2018

(54) SEMICONDUCTOR DEVICE

(71) Applicant: Kabushiki Kaisha Toshiba, Minato-ku, Tokyo (JP)

(72) Inventors: Tomohiro Tamaki, Nonoichi Ishikawa (JP); Kazutoshi Nakamura, Nonoichi Ishikawa (JP); Ryohei Gejo, Kanazawa Ishikawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 15/698,871

(22) Filed: Sep. 8, 2017

(65) Prior Publication Data
US 2018/0226399 A1    Aug. 9, 2018

(30) Foreign Application Priority Data

Feb. 9, 2017    (JP) .................. 2017/022571

(51) Int. Cl.
*H01L 29/66*    (2006.01)
*H01L 23/58*    (2006.01)
(Continued)

(52) U.S. Cl.
CPC ...... *H01L 27/0664* (2013.01); *H01L 29/0696* (2013.01); *H01L 29/1095* (2013.01);
(Continued)

(58) Field of Classification Search
CPC ............... H01L 27/0664; H01L 29/407; H01L 29/0696; H01L 29/8613; H01L 29/7397; H01L 29/1095
See application file for complete search history.

(56) References Cited

U.S. PATENT DOCUMENTS 8,102,025 B2    1/2012    Ozeki et al.
8,168,999 B2    5/2012    Tsuzuki et al.
(Continued)

FOREIGN PATENT DOCUMENTS

| JP | 5011748 B2 | 8/2012 |
| JP | 5206541 B2 | 6/2013 |
| JP | 2013-138069 A | 7/2013 |

*Primary Examiner* — Su C Kim
(74) *Attorney, Agent, or Firm* — White & Case LLP

(57) ABSTRACT

According to one embodiment, a semiconductor device includes a first electrode, first regions, second regions, an eighth semiconductor region, a ninth semiconductor region of the second conductivity type, a tenth semiconductor region, second electrodes, and a third electrode. Each first region includes a first semiconductor region, a second semiconductor region, a third semiconductor region, a fourth semiconductor region, and a gate electrode. The first regions and the second regions alternate in the second direction. Each of the second regions includes a fifth semiconductor region, a sixth semiconductor region, and a seventh semiconductor region. The eighth semiconductor region is provided between the first semiconductor regions and between the fifth semiconductor regions. The eighth semiconductor region is electrically connected to the first semiconductor regions. The third electrode is provided on the tenth semiconductor region with a first insulating layer interposed. The third electrode is electrically connected to the gate electrodes.

15 Claims, 22 Drawing Sheets

(51) Int. Cl.
  *H01L 27/06* (2006.01)
  *H01L 29/739* (2006.01)
  *H01L 29/861* (2006.01)
  *H01L 29/10* (2006.01)
  *H01L 29/06* (2006.01)
  *H01L 29/40* (2006.01)

(52) U.S. Cl.
  CPC ........ *H01L 29/407* (2013.01); *H01L 29/7397* (2013.01); *H01L 29/8613* (2013.01)

(56) References Cited

U.S. PATENT DOCUMENTS

| | | | |
|---|---|---|---|
| 2013/0240947 A1* | 9/2013 | Matsudai | H01L 29/7395 257/139 |
| 2014/0070270 A1* | 3/2014 | Yoshida | H01L 29/66128 257/140 |
| 2016/0043073 A1* | 2/2016 | Tamura | H01L 27/0664 257/140 |
| 2016/0240641 A1* | 8/2016 | Okawara | H01L 29/7397 |
| 2017/0077216 A1* | 3/2017 | Kouno | H01L 29/32 |
| 2017/0222029 A1* | 8/2017 | Kono | H01L 29/66969 |

* cited by examiner ic device. This semiconductor device desirably
SEMICONDUCTOR DEVICE

CROSS-REFERENCE TO RELATED APPLICATIONS

This application is based upon and claims the benefit of priority from Japanese Patent Application No. 2017-022571, filed on Feb. 9, 2017; the entire contents of which are incorporated herein by reference.

FIELD

Embodiments described herein relate generally to a semiconductor device.

BACKGROUND

As a semiconductor device to be used in power conversion or the like, there is an RC-IGBT (Reverse Conducting-Insulated Gate Bipolar Transistor) in which an FWD (Free Wheeling Diode) is incorporated in an IGBT (Insulated Gate Bipolar Transistor). This semiconductor device desirably has a high avalanche resistance.

DETAILED DESCRIPTION

Figure 1:
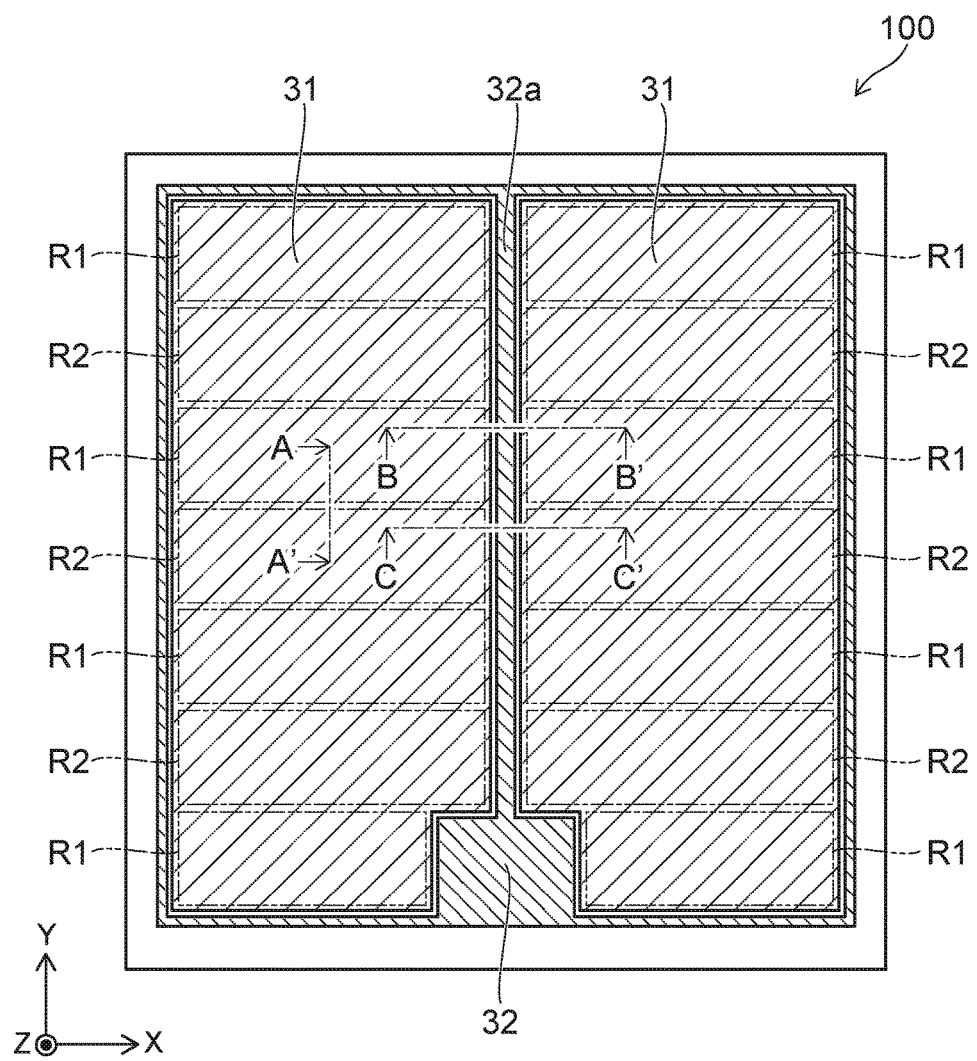
FIG. 1 is a plan view of a semiconductor device according to an embodiment.

According to one embodiment, a semiconductor device includes a first electrode, a plurality of first regions, a plurality of second regions, an eighth semiconductor region of the first conductivity type, a ninth semiconductor region of the second conductivity type, a tenth semiconductor region of the first conductivity type, a plurality of second electrodes, and a third electrode. Each of the first regions includes a first semiconductor region of a first conductivity type, a second semiconductor region of a second conductivity type, a third semiconductor region of the first conductivity type, a fourth semiconductor region of the second conductivity type, and a gate electrode. The first semiconductor region is provided on the first electrode. The second semiconductor region is provided on the first semiconductor region. The third semiconductor region is provided on the second semiconductor region. The fourth semiconductor region is provided on the third semiconductor region. The gate electrode is provided on the second semiconductor region. The gate electrode faces the third semiconductor region with a gate insulating layer interposed in a second direction. The second direction is perpendicular to a first direction directed from the first semiconductor region toward the second semiconductor region. The first regions are separated from each other in the second direction and a third direction. The third direction is perpendicular to the first direction and the second direction. The second regions are separated from each other in the second direction and the third direction. The first regions and the second regions alternate in the second direction. Each of the second regions includes a fifth semiconductor region of the second conductivity type, a sixth semiconductor region of the second conductivity type, and a seventh semiconductor region of the first conductivity type. The fifth semiconductor region is provided on the first electrode. The sixth semiconductor region of the second conductivity type is provided on the fifth semiconductor region. The seventh semiconductor region is provided on the sixth semiconductor region. The eighth semiconductor region is provided between the first semiconductor regions and between the fifth semiconductor regions in the third direction. The eighth semiconductor region is electrically connected to the first semiconductor regions. The ninth semiconductor region is provided on the eighth semiconductor region. The tenth semiconductor region of the first conductivity type is provided on the ninth semiconductor region. The second electrodes are provided on the third semiconductor regions, the fourth semiconductor regions, and the seventh semiconductor regions. The second electrodes are electrically connected to the fourth semiconductor regions and the seventh semiconductor regions. The third electrode is provided on the tenth semiconductor region with a first insulating layer interposed. The third electrode including an interconnect portion located between the second electrodes. The third electrode is separated from the second electrodes. The third electrode is electrically connected to the gate electrodes.

Embodiments of the invention will now be described with reference to the drawings.

The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

In the drawings and the specification of the application, components similar to those described thereinabove are marked with like reference numerals, and a detailed description is omitted as appropriate.

An XYZ orthogonal coordinate system is used in the description of the embodiments. A direction from a $p^+$-type collector region 1 toward a semiconductor layer 10 (an $n^-$-type semiconductor region 11) is taken as a Z-direction (a first direction). Two mutually-orthogonal directions perpendicular to the Z-direction are taken as an X-direction (a third direction) and a Y-direction (a second direction).

In the following description, the notations of $n^+$, n, $n^-$, $p^+$, and p indicate relative levels of the impurity concentrations of the conductivity types. In other words, a notation marked with "+" indicates an impurity concentration relatively higher than a notation not marked with either "+" or "−;" and a notation marked with "−" indicates an impurity concentration relatively lower than a notation not marked with either "+" or "−."

The embodiments described below may be implemented by reversing the p-type (a first conductivity type) and the n-type (a second conductivity type) of the semiconductor regions.

FIG. 1 is a plan view of a semiconductor device 100 according to an embodiment.

Figure 2:
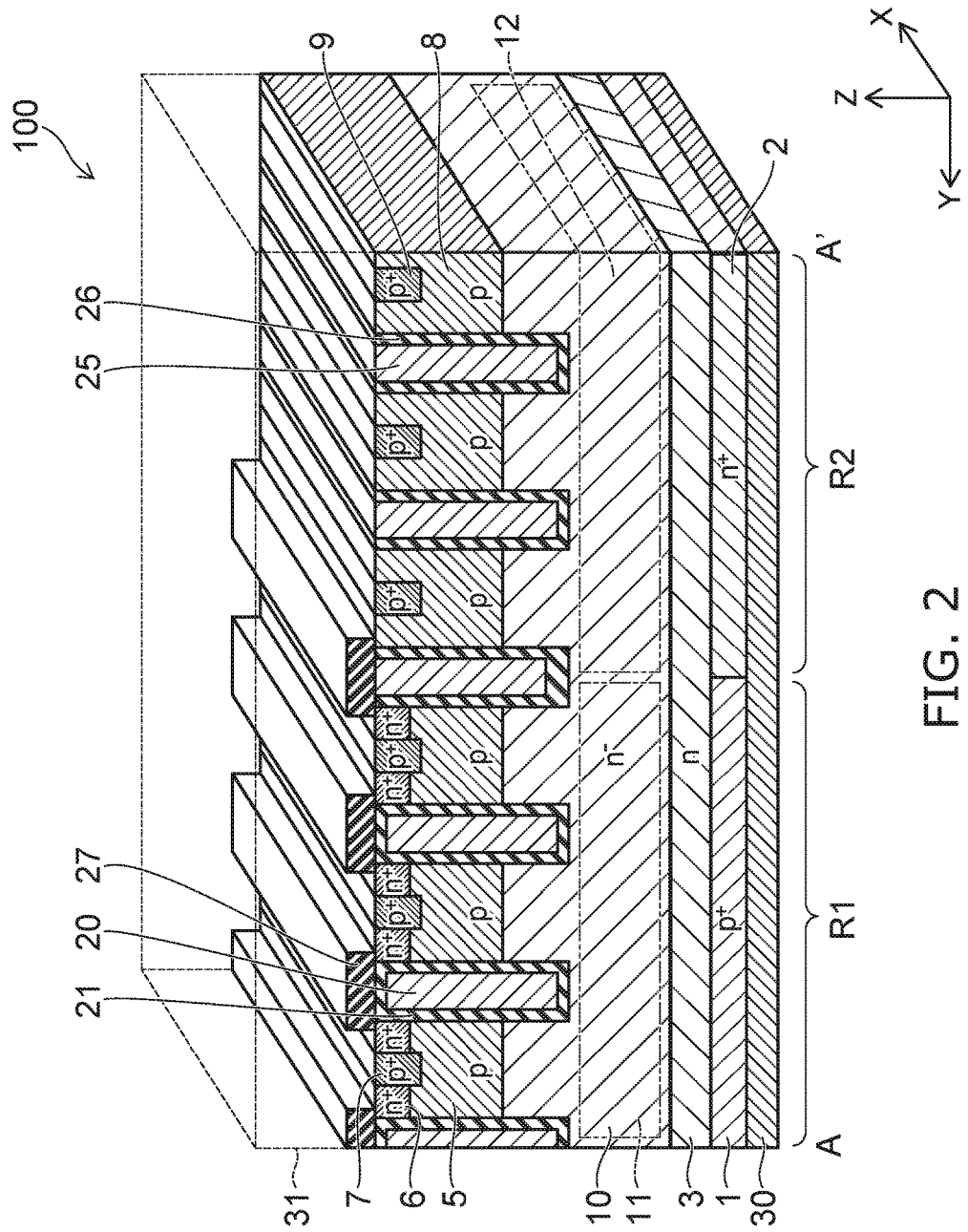
FIG. 2 is a perspective sectional view including an A-A' section of FIG. 1.

FIG. 2 is a perspective sectional view including an A-A' section of FIG. 1.

Figure 3:
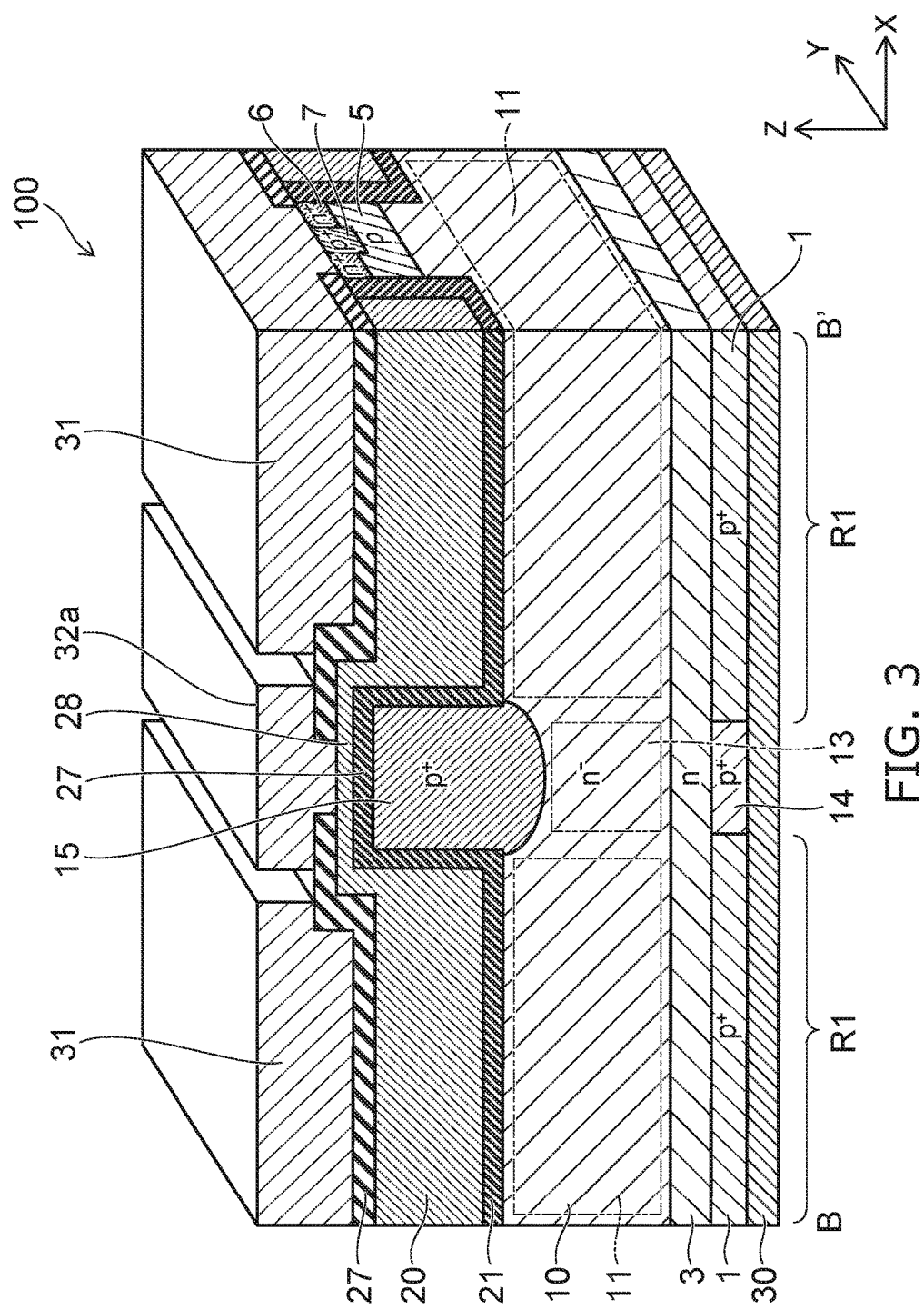
FIG. 3 is a perspective sectional view including a B-B' section of FIG. 1.

FIG. 3 is a perspective sectional view including a B-B' section of FIG. 1.

Figure 4:
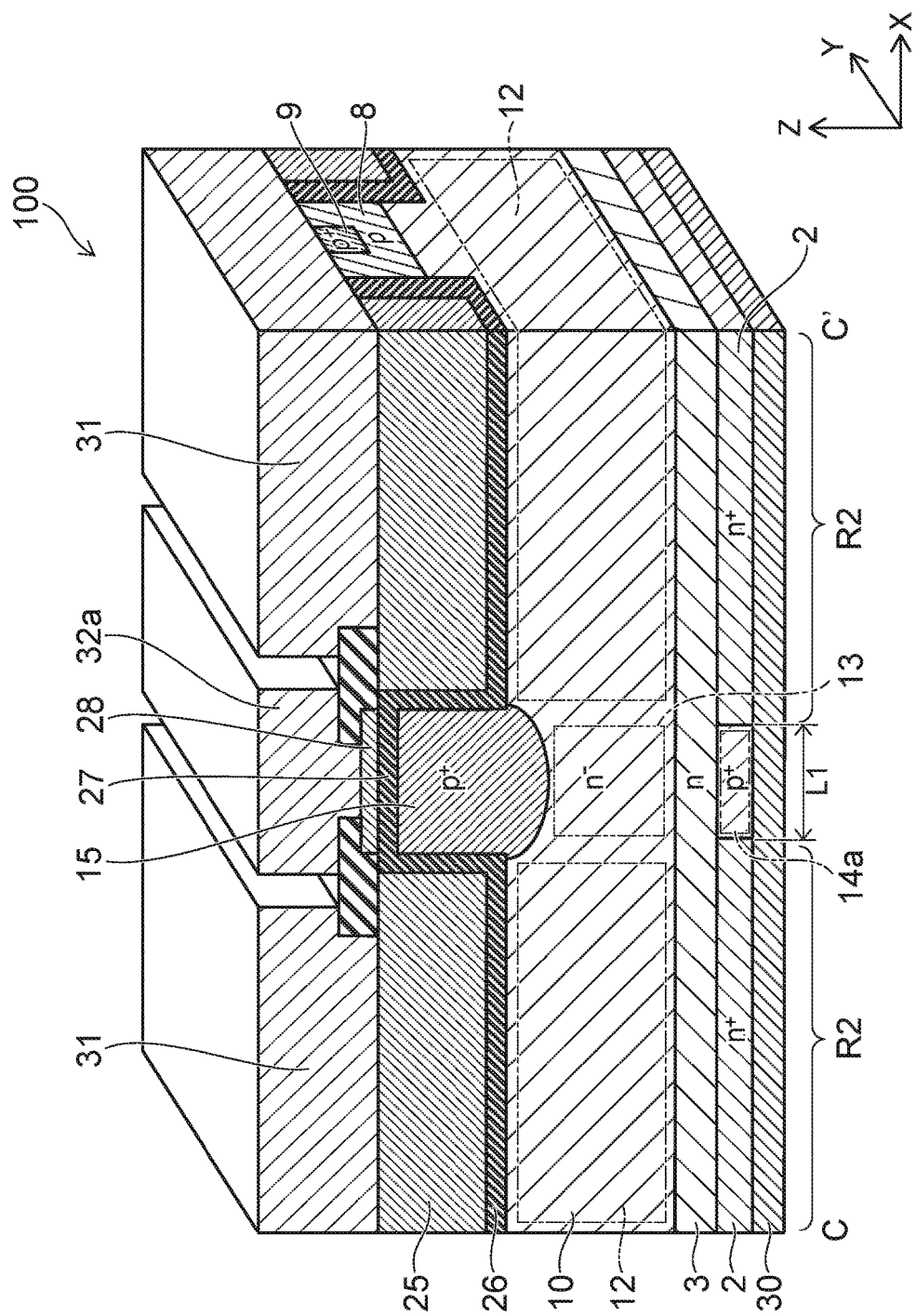
FIG. 4 is a perspective sectional view including a C-C' section of FIG. 1.

FIG. 4 is a perspective sectional view including a C-C' section of FIG. 1.

Figure 5:
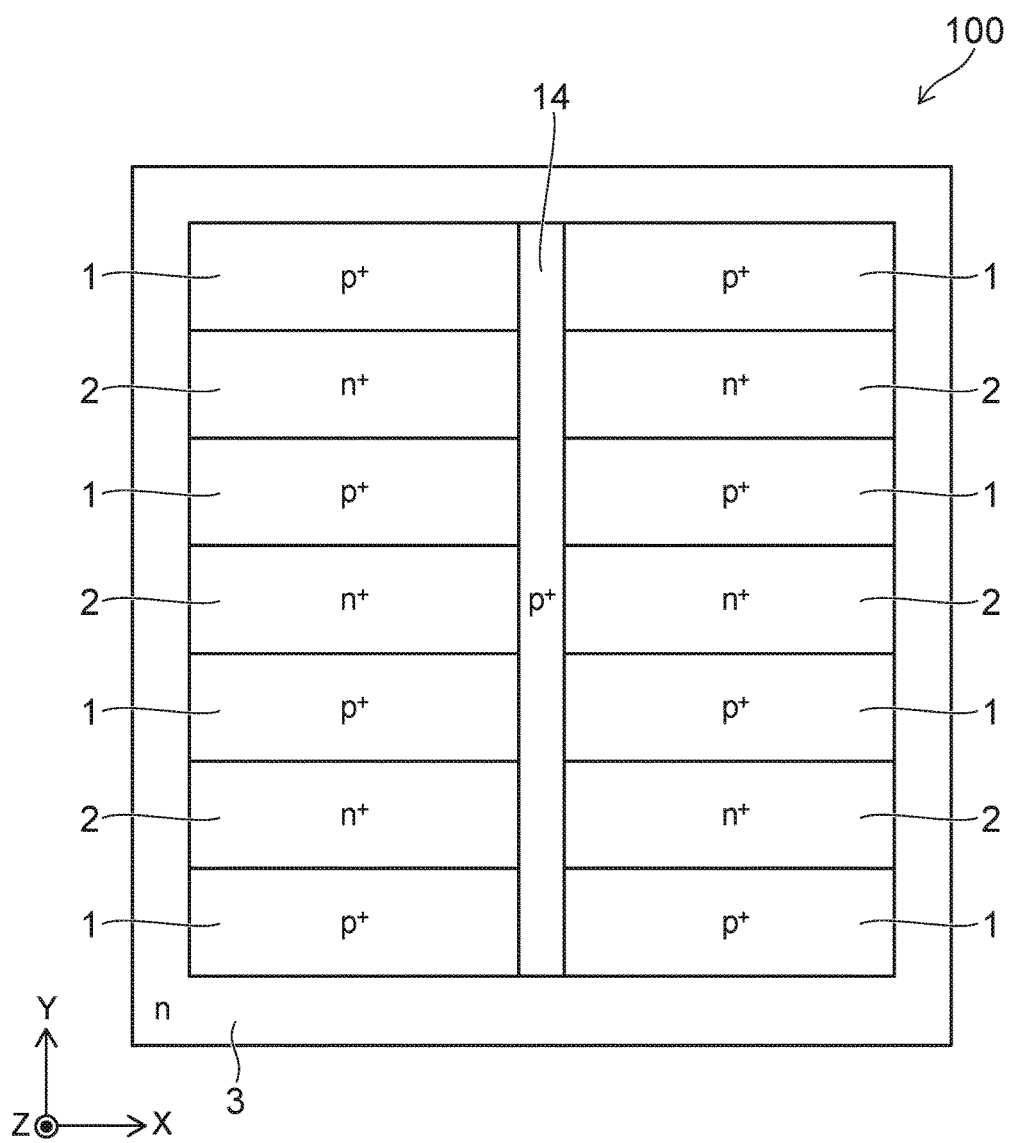
FIG. 5 is a plan view showing a structure of a lower surface of the semiconductor device according to the embodiment.

FIG. 5 is a plan view showing a structure of a lower surface of the semiconductor device 100 according to the embodiment.

In FIG. 2, an emitter electrode 31 is shown transparently.

The semiconductor device 100 is an RC-IGBT.

As shown FIGS. 1 to 5, the semiconductor device 100 includes a $p^+$-type collector region 1 (first semiconductor region), an $n^+$-type cathode region 2 (fifth semiconductor region), an n-type buffer region 3, a p-type base region 5 (third semiconductor region), an $n^+$-type emitter region 6 (fourth semiconductor region), a $p^+$-type contact region 7, a p-type anode region 8 (seventh semiconductor region), a $p^+$-type anode region 9, an $n^-$-type semiconductor layer 10, a $p^+$-type semiconductor region 14 (eighth semiconductor region), a $p^+$-type semiconductor region 15 (tenth semiconductor region), a gate electrode 20, a gate insulating layer 21, a field plate electrode 25 (fourth electrode), an insulating layer 26 (second insulating layer), an insulating layer 27 (first insulating layer), a contact portion 28, a collector electrode 30 (first electrode), an emitter electrode 31 (second electrode), and a gate pad 32 (third electrode).

As shown in FIG. 1, the semiconductor device 100 includes a plurality of IGBT regions R1 (first regions) and a plurality of FWD regions R2 (second regions). The plurality of IGBT regions R1 is separated from each other in the X-direction and the Y-direction. The plurality of FWD regions R2 is separated from each other in the X-direction and the Y-direction. The IGBT regions R1 and the FWD regions R2 alternate in the Y-direction.

As shown in FIG. 1, the emitter electrode 31 and the gate pad 32 are separated from each other on an upper surface of the semiconductor device 100. The emitter electrode 31 is multiply provided in the X-direction. Each emitter electrode 31 is provided on the IGBT regions R1 and the FWD regions R2 that alternate in the Y-direction. The gate pad 32 includes an interconnect portion 32a surrounding the plurality of emitter electrodes 31.

A part of the interconnect portion 32a extends in the Y-direction between the emitter electrodes 31. The part of the interconnect portion 32a is located between the IGBT regions R1 adjacent to each other in the X-direction and between the FWD regions R2 adjacent to each other in the X-direction when viewed from the Z-direction.

As shown in FIG. 2, the collector electrode 30 is provided on a lower surface of the semiconductor device 100. The $p^+$-type collector region 1 and the $n^+$-type cathode region 2 are provided on the collector electrode 30 and electrically connected to the collector electrode 30. The n-type buffer region 3 is provided on the $p^+$-type collector region 1 and the $n^+$-type cathode region 2.

The $n^-$-type semiconductor layer 10 is provided on the n-type buffer region 3. The $n^-$-type semiconductor layer 10 includes an $n^-$-type semiconductor region 11 (second semiconductor region) and an $n^-$-type semiconductor region 12 (sixth semiconductor region). The $n^-$-type semiconductor region 11 is located on the $p^+$-type collector region 1. The $n^-$-type semiconductor region 12 is located on the $n^+$-type cathode region 2.

The p-type base region 5 and the gate electrode 20 are provided on the $n^-$-type semiconductor region 11. The gate electrode 20 faces the p-type base region 5 with the gate insulating layer 21 interposed in the Y-direction. The $n^+$-type emitter region 6 and the $p^+$-type contact region 7 are selectively provided on the p-type base region 5.

The p-type anode region 8 and the field plate electrode 25 are provided on the $n^-$-type semiconductor region 12. The field plate electrode 25 faces the p-type anode region 8 with the insulating layer 26 interposed in the Y-direction. The $p^+$-type anode region 9 is selectively provided on the p-type anode region 8.

The emitter electrode 31 is provided on the p-type base region 5, the $n^+$-type emitter region 6, the $p^+$-type contact region 7, the p-type anode region 8, the $p^+$-type anode region 9, and the field plate electrode 25, and electrically connected to these members. The insulating layer 27 is provided between the gate electrode 20 and the emitter electrode 31, and these electrodes are electrically separated from each other.

A plurality of p-type base regions 5, a plurality of $n^+$-type emitter regions 6, a plurality of $p^+$-type contact regions 7, a plurality of p-type anode regions 8, a plurality of $p^+$-type anode regions 9, a plurality of gate electrodes 20, and a plurality of field plate electrodes 25 are provided in the Y-direction, and each of them extends in the X-direction.

The IGBT region R1 includes the $p^+$-type collector region 1, a part of the n-type buffer region 3, the $n^-$-type semiconductor region 11, the p-type base region 5, the n⁺-type emitter region 6, the p⁺-type contact region 7, the gate electrode 20, the gate insulating layer 21, and the insulating layer 27 described above.

The FWD region R2 includes the n⁺-type cathode region 2, another part of the n-type buffer region 3, the n⁻-type semiconductor region 12, the p-type anode region 8, the p⁺-type anode region 9, the field plate electrode 25, and the insulating layer 26 described above.

As shown in FIGS. 3 and 4, the p⁺-type semiconductor region 14 is provided between the p⁺-type collector regions 1 and between the n⁺-type cathode regions 2 in the X-direction. The n⁻-type semiconductor layer 10 further includes an n⁻-type semiconductor region 13 (ninth semiconductor region) provided on the p⁺-type semiconductor region 14.

The p⁺-type semiconductor region 15 is provided on the n⁻-type semiconductor region 13. The p⁺-type semiconductor region 15 is provided between the p-type base regions 5, between the p-type anode regions 8, between the gate electrodes 20, and between the field plate electrodes 25 in the X-direction. The p⁺-type semiconductor region 15 is in contact with the p-type base region 5 and the p-type anode region 8 in the Y-direction. The p⁺-type semiconductor region 15 is electrically connected to the emitter electrode 31 via the p-type base region 5 and the p-type anode region 8.

A length in the Z-direction of the p⁺-type semiconductor region 15 is larger than a length in the Z-direction of the gate electrode 20 and larger than a length in the Z-direction of the field plate electrodes 25. A lower end of the p⁺-type semiconductor region 15 is located on a lower side of a lower end of the gate insulating layer 21 and a lower end of the insulating layer 26.

A concentration of a p-type impurity in the p⁺-type semiconductor region 14 is, for example, the same as a concentration of a p-type impurity in the p⁺-type collector region 1. Or the concentration of a p-type impurity in the p⁺-type semiconductor region 14 may be different from the concentration of a p-type impurity in the p⁺-type collector region 1.

The p⁺-type collector region 1 and the p⁺-type semiconductor region 14 are, for example, integrally formed. Or the p⁺-type collector region 1 and the p⁺-type semiconductor region 14 may be separately formed.

The contact portion 28 is electrically connected to the gate electrode 20. The contact portion 28 is provided on the p⁺-type semiconductor region 15 with the insulating layer 27 interposed. A part of the interconnect portion 32a is provided on the contact portion 28 and is electrically connected to the contact portion 28. In other words, the gate electrodes 20 of each IGBT region R1 is electrically connected to the gate pad 32 shown in FIG. 1 via the contact portion 28.

As shown in FIG. 5, the p⁺-type semiconductor region 14 extends in the Y-direction between the p⁺-type collector regions 1 and between the n⁺-type cathode regions 2. The plurality of p⁺-type collector regions 1 arranged in the Y-direction is electrically connected to each other via the p⁺-type semiconductor region 14. A part of the n-type buffer region 3 is, for example, provided around the plurality of p⁺-type collector regions 1, the plurality of n⁺-type cathode regions 2, and the p⁺-type semiconductor region 14.

Examples of materials of the respective constituent elements will be described.

The p⁺-type collector region 1, the n⁺-type cathode region 2, the n-type buffer region 3, the p-type base region 5, the n⁺-type emitter region 6, the p⁺-type contact region 7, the p-type anode region 8, the p⁺-type anode region 9, and the n⁻-type semiconductor layer 10 contain silicon, silicon carbide, gallium nitride, or gallium arsenide as a semiconductor material. In the case where silicon is used as the semiconductor material, as an n-type impurity, arsenic, phosphorus, or antimony can be used. As a p-type impurity, boron can be used.

The gate electrode 20, the field plate electrode 25, and the contact portion 28 contain a conductive material such as polysilicon. The gate insulating layer 21, the insulating layer 26, and the insulating layer 27 contain an insulating material such as silicon oxide. The collector electrode 30, the emitter electrode 31, and the gate pad 32 contain a metal such as aluminum.

Next, an operation of the semiconductor device 100 will be described.

When a voltage of a threshold value or more is applied to the gate electrode 20 in a state where a positive voltage is applied to the collector electrode 30 with respect to the emitter electrode 31, a channel (inversion layer) is formed in a region near the gate insulating layer 21 in the p-type base region 5. The IGBT region R1 is brought into an on-state. At this time, electrons are injected into the n⁻-type semiconductor layer 10 from the n⁺-type emitter region 6 through this channel, and holes are injected into the n⁻-type semiconductor layer 10 from the p⁺-type collector region 1. Thereafter, when a voltage applied to the gate electrode 20 is decreased to less than the threshold value, the channel in the p-type base region 5 disappears. The IGBT regions R1 is brought into an off-state.

In the case where, for example, a bridge circuit is formed by a plurality of semiconductor devices 100, when one semiconductor device 100 is switched from an on-state to an off-state, an induced electromotive force is applied to the emitter electrode 31 of another semiconductor device 100. This is based on an inductance component of the bridge circuit. According to the induced electromotive force, the FWD region R2 in this another semiconductor device 100 operates. At this time, holes are injected into the n⁻-type semiconductor layer 10 from the p-type base region 5 (p-type contact region 7), and electrons are injected into the n⁻-type semiconductor layer 10 from the n⁺-type cathode region 2.

An effect of the embodiment will be described with reference to FIG. 6.

Figure 6:
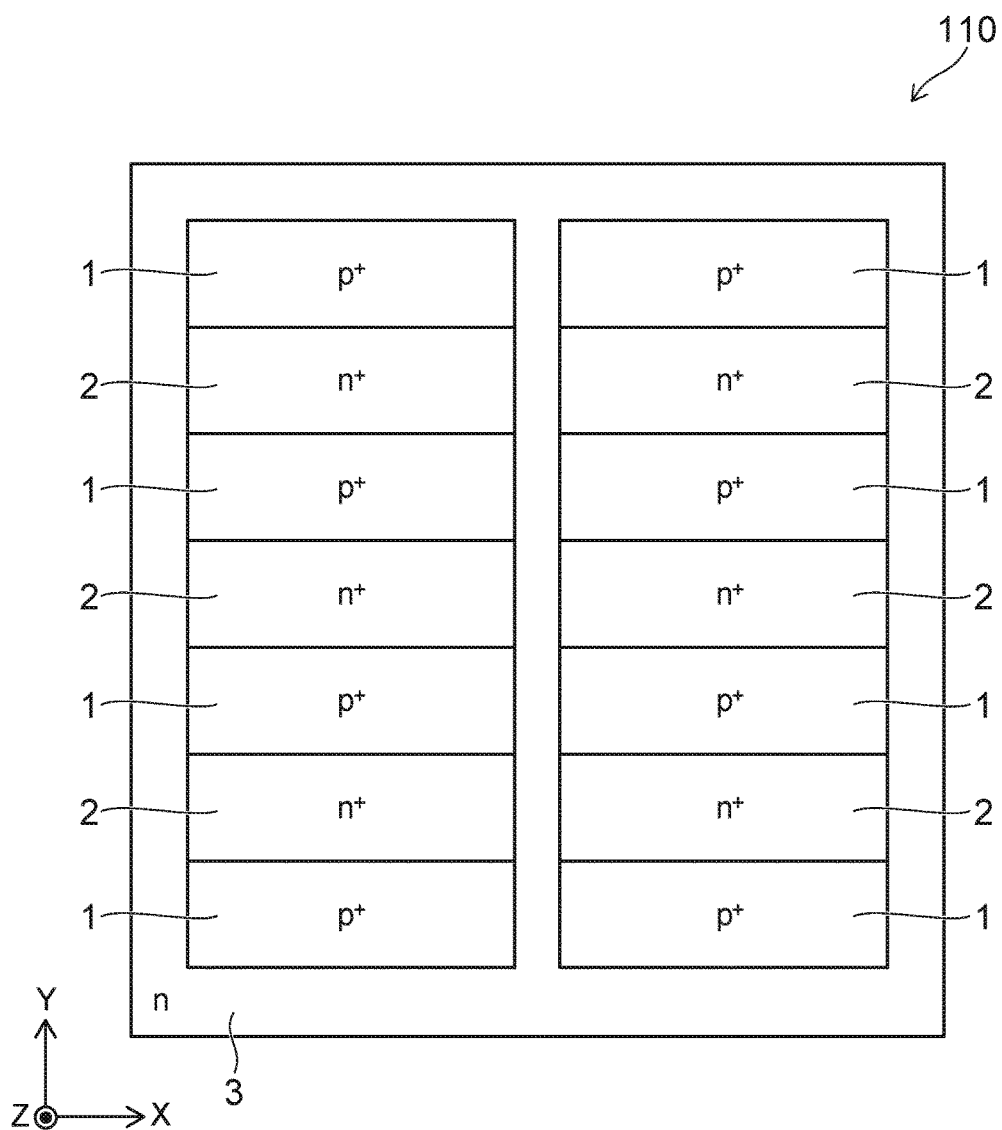
FIG. 6 is a plan view showing a structure of a lower surface of a semiconductor device according to a reference example.

FIG. 6 is a plan view showing a structure of a lower surface of a semiconductor device 110 according to a reference example.

As shown in FIG. 6, the semiconductor device 110 does not have the p⁺-type semiconductor region 14 in comparison with the semiconductor device 100. In the semiconductor device 110, in place of the p⁺-type semiconductor region 14, a part of the n-type buffer region 3 is provided between the p⁺-type collector regions 1 and between the n⁺-type cathode regions 2. Although not shown in FIG. 6, in the semiconductor device 110, the p⁺-type semiconductor region 15 shown in FIGS. 3 and 4 is not provided.

When the semiconductor devices 100 and 110 are turned off, a large voltage is applied to the collector electrode 30 with respect to the emitter electrode 31 by an induced electromotive force or the like. Due to the large voltage, the semiconductor devices 100 and 110 are shifted to an avalanche state. At this time, impact ionization occurs in a bottom portion of the gate insulating layer 21 or in a bottom portion of the insulating layer 26, and electrons and holes are generated in the n⁻-type semiconductor layer 10. The generated electrons are drifted toward the collector electrode 30 to decrease a potential on a side of the collector electrode 30 of the n⁻-type semiconductor layer 10. A built-in potential between the n⁻-type semiconductor region 11 and the p⁺-type collector region 1 decreases. Holes are injected into the n⁻-type semiconductor region 11 from the p⁺-type collector region 1, and a current flows through the semiconductor devices 100 and 110.

The ease of occurrence of impact ionization varies from each gate insulating layer 21 and each insulating layer 26. This is based on a variation in depth, shape, or the like of the gate insulating layer 21 and the insulating layer 26. When impact ionization occurs locally in a part of the gate insulating layers 21 and the insulating layers 26, a current flows locally in the p⁺-type collector region 1 (IGBT region R1) near the part. According to this local current flow, a current filament occurs.

In a place where the current filament occurs, a temperature increases with the lapse of time. When the temperature increases, a mean free path length of a carrier decreases. Due to this, impact ionization becomes less likely to occur. Therefore, when the temperature increases, the current filament moves to a region having a low temperature adjacent thereto.

In the FWD region R2 where the n⁺-type cathode region 2 is provided on the lower surface, holes are not injected from the collector electrode 30. Due to this configuration, the current filament does not move to the FWD region R2. In the case of the semiconductor device 110 according to the reference example, the current filament continues to move in the IGBT region R1.

For example, when a temperature on a center side of the IGBT region R1 increases, a part of the current filament moves to a vicinity of a boundary between the IGBT region R1 and the FWD region R2. At this time, the current filament does not move to the FWD region R2, or move to a center side of the IGBT region R1 having an increased temperature. The current filament continues to occur in the vicinity of the boundary between the IGBT region R1 and the FWD region R2. As a result, the temperature in the vicinity of the boundary between the IGBT region R1 and the FWD region R2 continues to increase by the current filament. Finally, the semiconductor device 110 is destroyed by thermal runaway.

In the semiconductor device 100 according to the embodiment, the p⁺-type semiconductor region 14 is provided between the p⁺-type collector regions 1 and between the n⁺-type cathode regions 2 in the X-direction. The plurality of p⁺-type collector regions 1 is electrically connected to each other via the p⁺-type semiconductor region 14. The p⁺-type semiconductor region 15 electrically connected to the emitter electrode 31 is provided on an upper side of the p⁺-type semiconductor region 14.

Holes are injected into the n⁻-type semiconductor layer from the collector electrode 30 through the p⁺-type semiconductor region 14. Therefore, the current filament moves to the p⁺-type semiconductor region 14 on an outside of the IGBT region R1, and can move to another IGBT region R1. Further, in the case where the p⁺-type semiconductor region 15 is provided on an upper side of the p⁺-type semiconductor region 14, impact ionization occurs on a p-n junction surface between the n⁻-type semiconductor region 13 and the p⁺-type semiconductor region 15. According to this configuration, the current filament easily moves to a region where the p⁺-type semiconductor region 14 is provided. As a result, a local increase in temperature in the semiconductor device 100 is suppressed. A possibility that the semiconductor device 100 is destroyed by the current filament can be decreased. That is, the avalanche resistance is enhanced.

On the p⁺-type semiconductor region 15, the interconnect portion 32a of the gate pad 32 is provided with the insulating layer 27 interposed, and the interconnect portion 32a and the gate electrodes 20 of each IGBT region R1 are electrically connected to each other. According to this configuration, a distance between the pad portion of the gate pad 32 and each gate electrode 20 can be decreased. Therefore, delay of a signal to the gate electrode 20 when a voltage is applied to the pad portion can be suppressed.

As described above, according to the embodiment, while enhancing the avalanche resistance, delay of a gate signal can be suppressed.

A concentration of a p-type impurity in the p⁺-type semiconductor region 15 is higher than a concentration of a p-type impurity in the p-type base region 5, and is higher than a concentration of a p-type impurity in the p-type anode region 8. According to this configuration, in the case where a current filament occurs in the vicinity of the p⁺-type semiconductor region 15, holes are discharged to the emitter electrode 31 in a shorter time. An increase in potential of the p-type base region 5 is suppressed. An n-p-n parasitic transistor composed of the n⁺-type emitter region 6, the p-type base region 5, and the n⁻-type semiconductor layer 10 becomes difficult to operate. As a result, a possibility that the semiconductor device 100 is destroyed can be further decreased.

An experimental result of the semiconductor device 100 according to the embodiment will be described with reference to FIG. 7.

Figure 7:
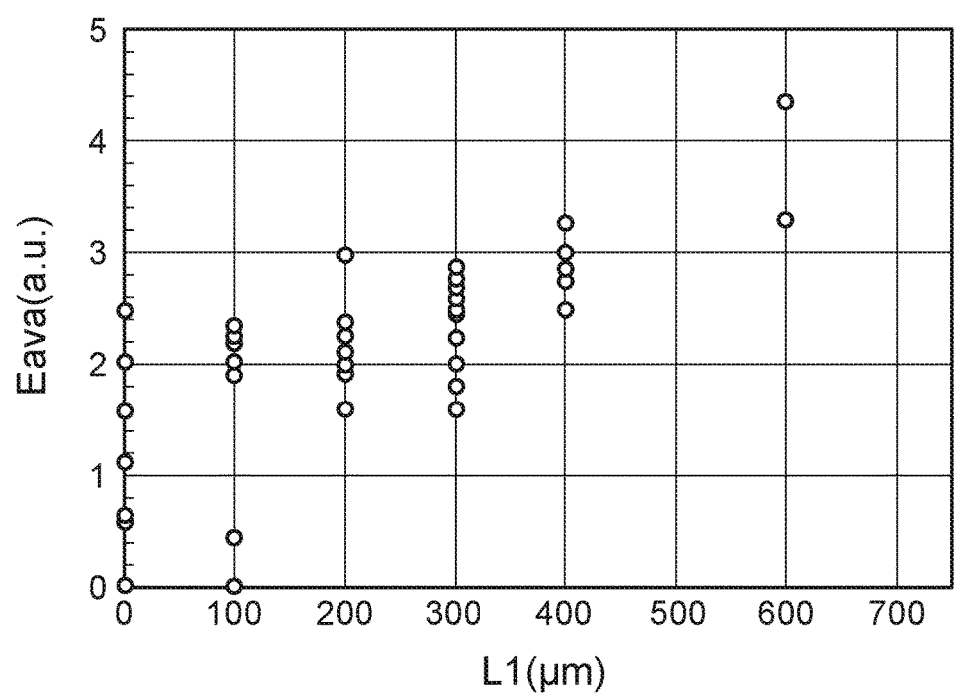
FIG. 7 is a graph showing a characteristic of the semiconductor device according to the embodiment.

FIG. 7 is a graph showing a characteristic of the semiconductor device according to the embodiment.

The p⁺-type semiconductor region 14 includes a first portion 14a as shown in FIG. 4. The first portion 14a is provided between the n⁺-type emitter regions 6 in the X-direction.

In FIG. 7, a horizontal axis represents a length L1 (µm) in the X-direction of the first portion 14a, and a vertical axis represents an avalanche resistance $E_{ava}$ of the semiconductor device 100. That is, FIG. 7 shows a change in the avalanche resistance $E_{ava}$ when the length L1 of the first portion 14a is changed. In FIG. 7, the avalanche resistance $E_{ava}$ of each semiconductor device 100 is expressed by a relative ratio.

In an experiment related to FIG. 7, a plurality of semiconductor devices 100 in which the length L1 is changed are used. The voltage of the collector electrode 30 in an off-state is set to 600 V. The avalanche resistance $E_{ava}$ of each semiconductor device 100 is measured.

From the experimental result shown in FIG. 7, it is found that when the length L1 is 100 µm or less, a variation in the avalanche resistance $E_{ava}$ is large, and also an average of the avalanche resistance $E_{ava}$ is low. It is found that when the length L1 is 200 µm or more, a high avalanche resistance $E_{ava}$ is obtained as compared with the case where the length L1 is 500 µm or less. Therefore, the length L1 is desirably 520 µm or more.

In the semiconductor device 100 according to the embodiment, the n-type buffer region 3, the p⁺-type contact region 7, the p⁺-type anode region 9, the field plate electrode 25, and the insulating layer 26 are not essential, and it is also possible to omit these constituent elements. The arrangement, shape, number, etc. of the IGBT region R1 and the FWD region R2 are not limited to the examples shown in FIGS. 1 to 5, and can be appropriately changed.

Figure 8:
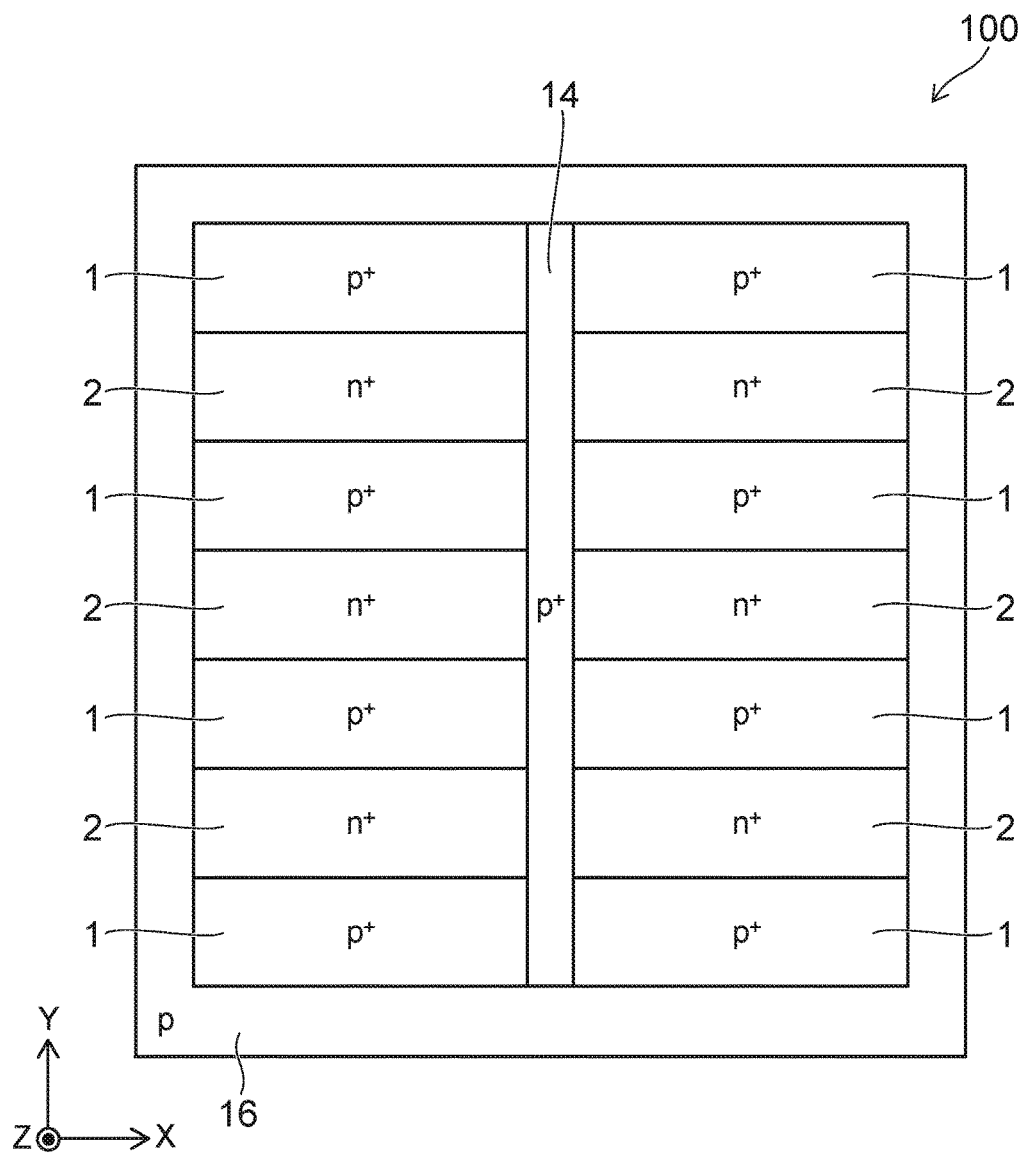
FIG. 8 is a plan view showing a structure of a lower surface of another semiconductor device according to the embodiment.

FIG. 8 is a plan view showing a structure of a lower surface of another semiconductor device according to the embodiment.

In the example shown in FIG. 5, a part of the n-type buffer region 3 is provided around the p+-type collector region 1 and the p+-type semiconductor region 14. A p-type semiconductor region 16 may be provided as shown in FIG. 8, in place of the n-type buffer region 3.

A concentration of a p-type impurity in the p-type semiconductor region 16 is, for example, lower than a concentration of a p-type impurity in the p+-type collector region 1. Alternatively, a concentration of a p-type impurity in the p-type semiconductor region 16 may be the same as a concentration of a p-type impurity in the p+-type collector region 1. The p-type semiconductor region 16 may be integrally formed with the p+-type collector region 1 and the p+-type semiconductor region 14.

(First Variation)

Figure 9:
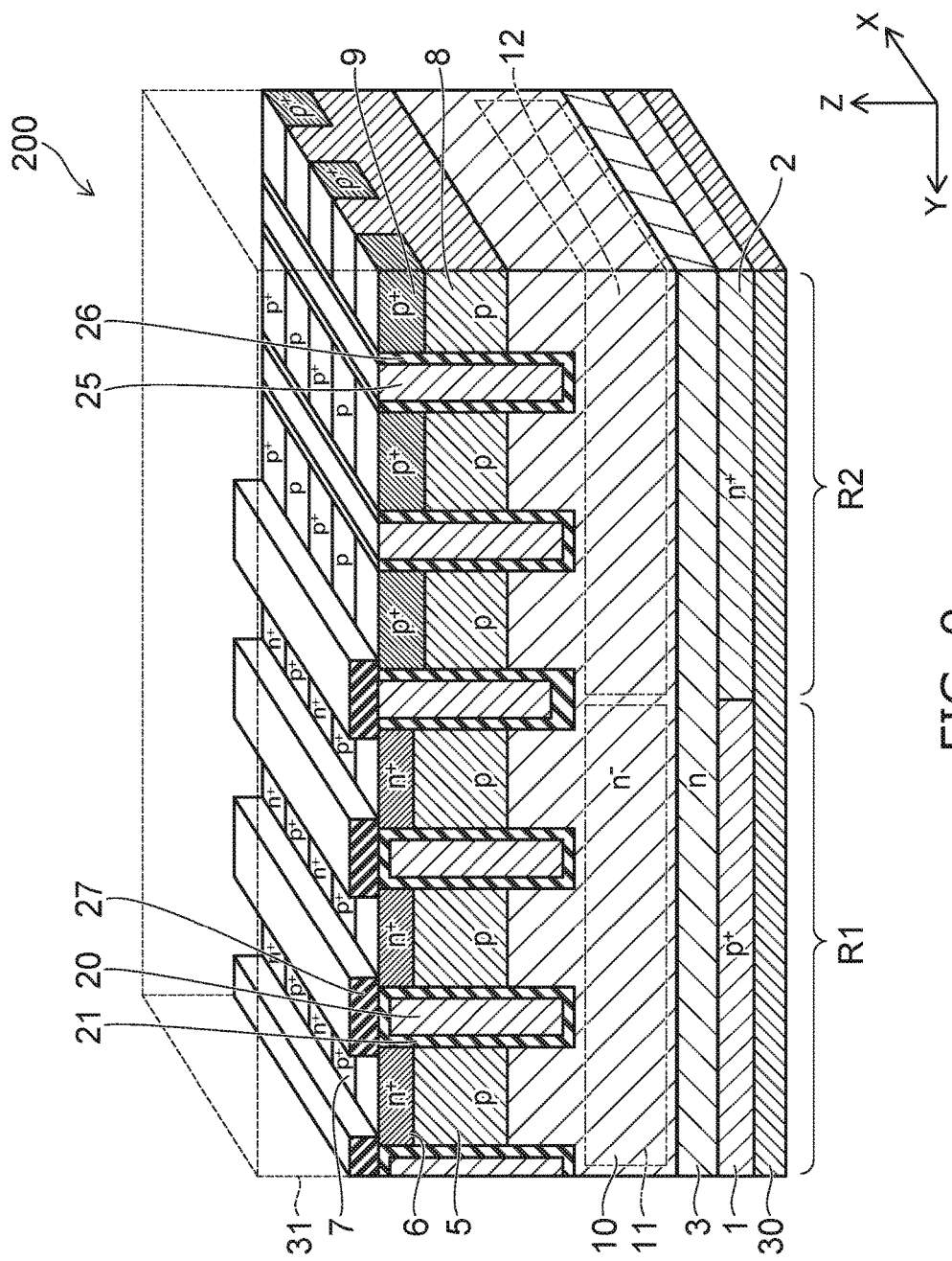
FIG. 9 is a sectional view showing a part of a semiconductor device according to a first variation of the embodiment.

FIG. 9 is a sectional view showing a part of a semiconductor device 200 according to a first variation of the embodiment.

The semiconductor device 200 is different from the semiconductor device 100 in the arrangement of the n+-type emitter region 6 and the p+-type contact region 7 provided on the p-type base region 5, and the arrangement of the p+-type anode region 9 provided on the p-type anode region 8.

In the semiconductor device 100, the n+-type emitter region 6 and the p+-type contact region 7 are arranged within the Y-direction on the p-type base region 5. Each of the n+-type emitter region 6 and the p+-type contact region 7 extends in the X-direction.

In the semiconductor device 200, the n+-type emitter regions 6 and the p+-type contact regions 7 alternate in the X-direction on the p-type base region 5. A plurality of p+-type anode regions 9 is provided on the p-type anode region 8. The p+-type anode regions 9 are separated from each other in the X-direction.

Also in the semiconductor device 200 according to the variation, in the same manner as the semiconductor device 100 shown in FIGS. 3 to 5, delay of a gate signal can be suppressed while enhancing the avalanche resistance of the semiconductor device 200 by providing the p+-type semiconductor region 14 and the p+-type semiconductor region 15.

(Second Variation)

Figure 10:
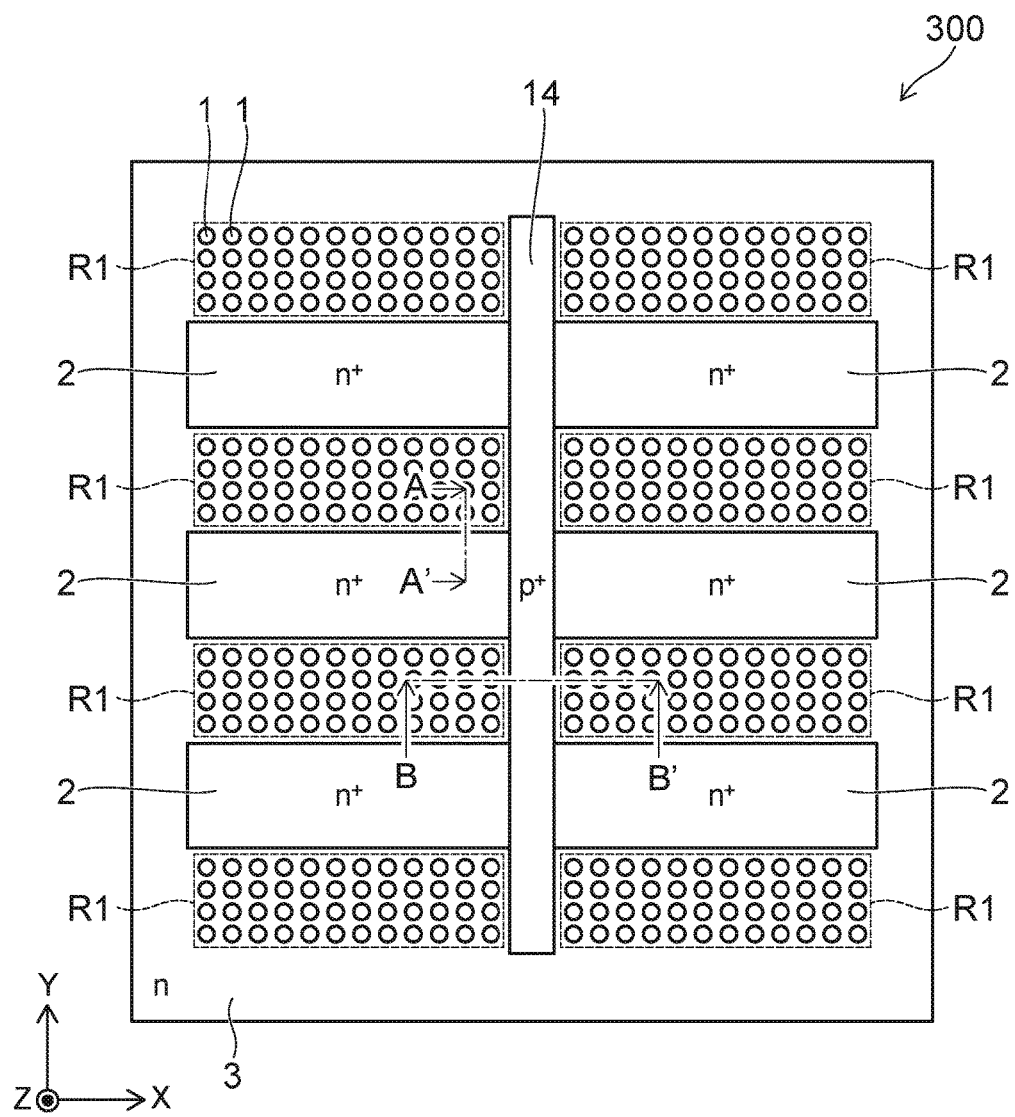
FIG. 10 is a plan view showing a structure of a lower surface of a semiconductor device according to a second a variation of the embodiment.

FIG. 10 is a plan view showing a structure of a lower surface of a semiconductor device 300 according to a second variation of the embodiment.

Figure 11:
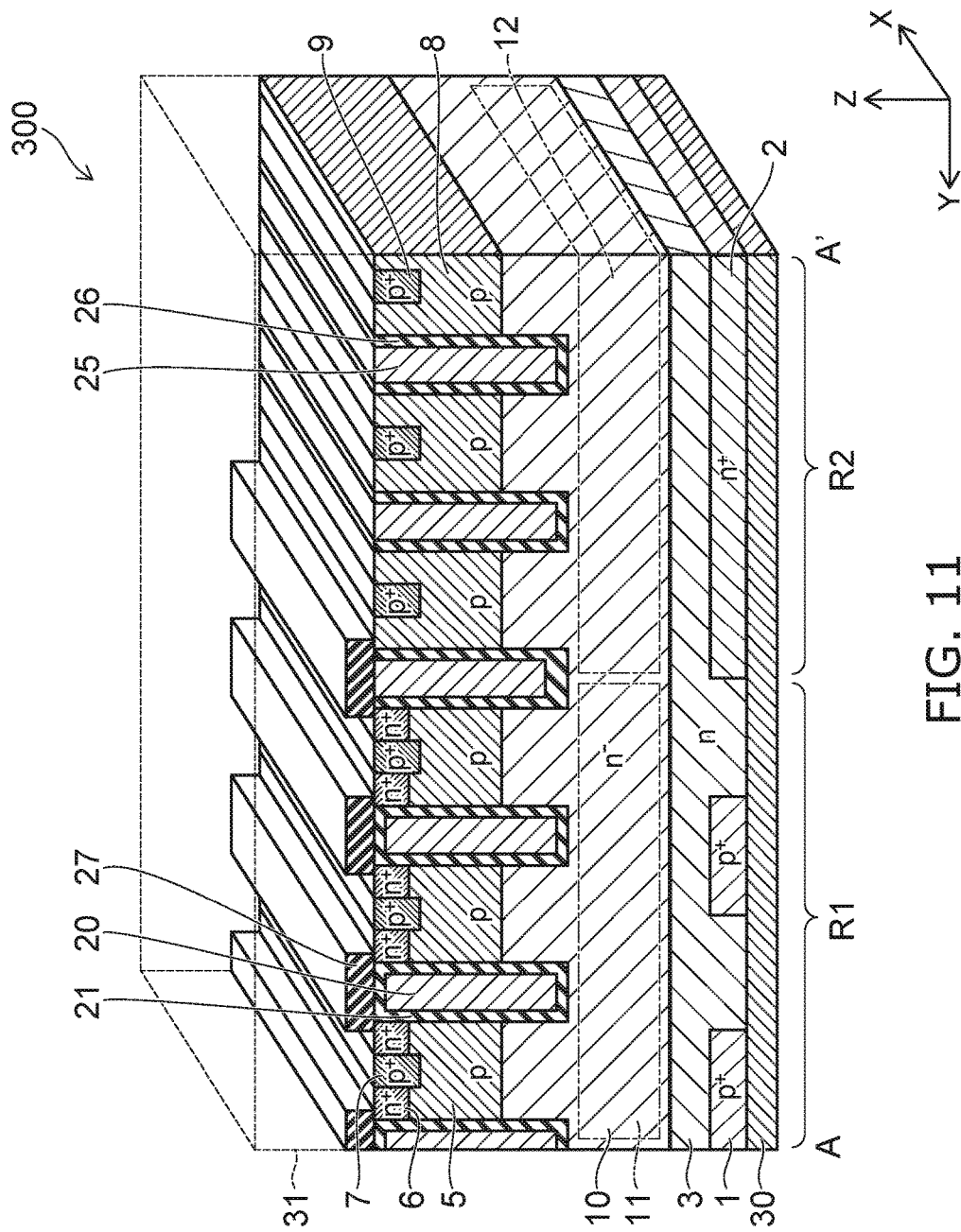
FIG. 11 is a perspective sectional view including an A-A' section of FIG. 10.

FIG. 11 is a perspective sectional view including an A-A' section of FIG. 10.

Figure 12:
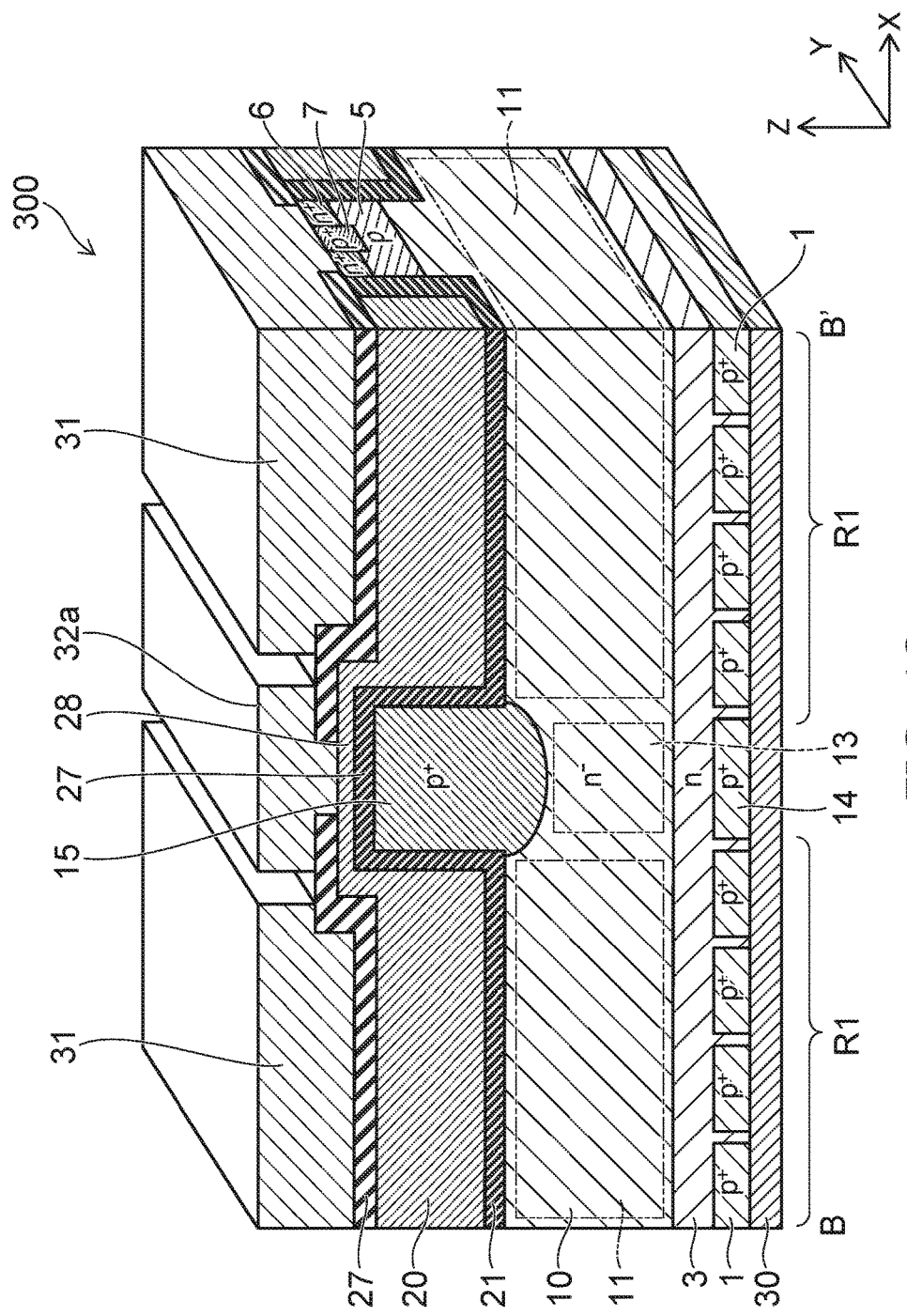
FIG. 12 is a perspective sectional view including a B-B' section of FIG. 10.

FIG. 12 is a perspective sectional view including a B-B' section of FIG. 10.

The semiconductor device 300 is different from the semiconductor device 100 in that a plurality of p+-type collector regions 1 is arranged in the IGBT region R1. The p+-type collector regions 1 are separated from each other. The plurality of p+-type collector regions 1 is, for example, arranged along the X-direction and the Y-direction as shown in FIG. 10. As shown in FIGS. 11 and 12, an n-type semiconductor region (a part of the n-type buffer region 3) is provided between the p+-type collector regions 1.

A distance between the adjacent p+-type collector regions 1 is set so that a current filament can move between these p+-type collector regions 1. For example, the distance between the p+-type collector regions 1 is smaller than the length in the X-direction or the Y-direction of the p+-type collector region 1. The distance between the p+-type collector regions 1 may be 10 μm or less.

An effective concentration of a p-type impurity in the lower surface of the IGBT region R1 can be decreased by providing the p+-type collector regions 1 which are separated from each other in the IGBT region R1. Due to the decrease of the effective concentration, injection of holes from the lower surface when the IGBT region R1 is operated is suppressed, and a switching time is reduced, and thus, switching loss can be reduced.

Also in the variation, the p+-type semiconductor region 14 extends in the Y-direction between the IGBT regions R1 and between the n+-type cathode regions 2. Therefore, a current filament occurring in the IGBT region R1 can move to another IGBT region R1. A possibility that the semiconductor device 300 is destroyed by the current filament can be decreased.

A shape of an outer periphery of the p+-type collector region 1 is arbitrary. In the example shown in FIG. 10, the outer periphery of the p+-type collector region 1 is circular. The shape of the outer periphery may be elliptical or polygonal.

(Third Variation)

Figure 13:
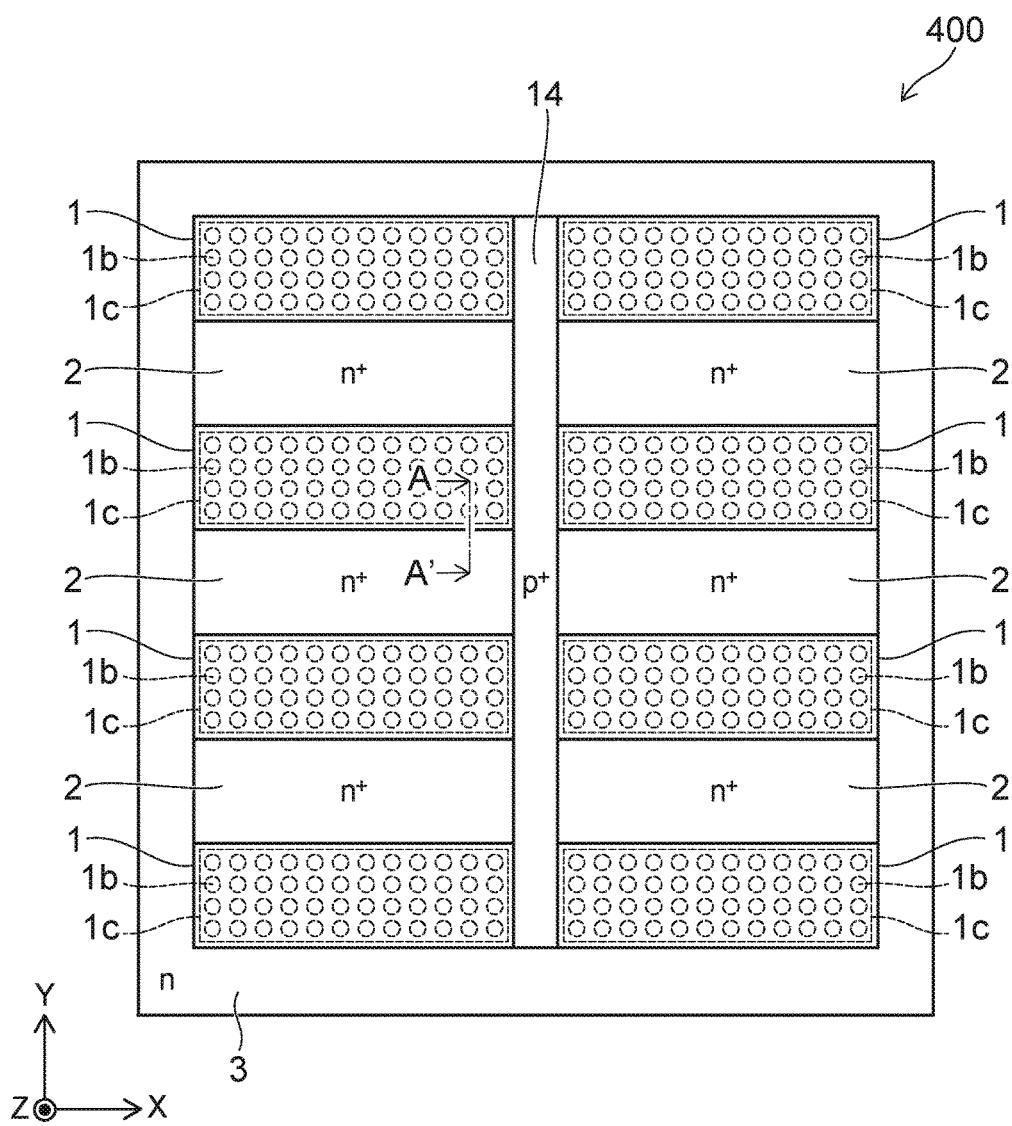
FIG. 13 is a plan view showing a structure of a lower surface of a semiconductor device according to a third variation of the embodiment.

FIG. 13 is a plan view showing a structure of a lower surface of a semiconductor device 400 according to a third variation of the embodiment.

Figure 14:
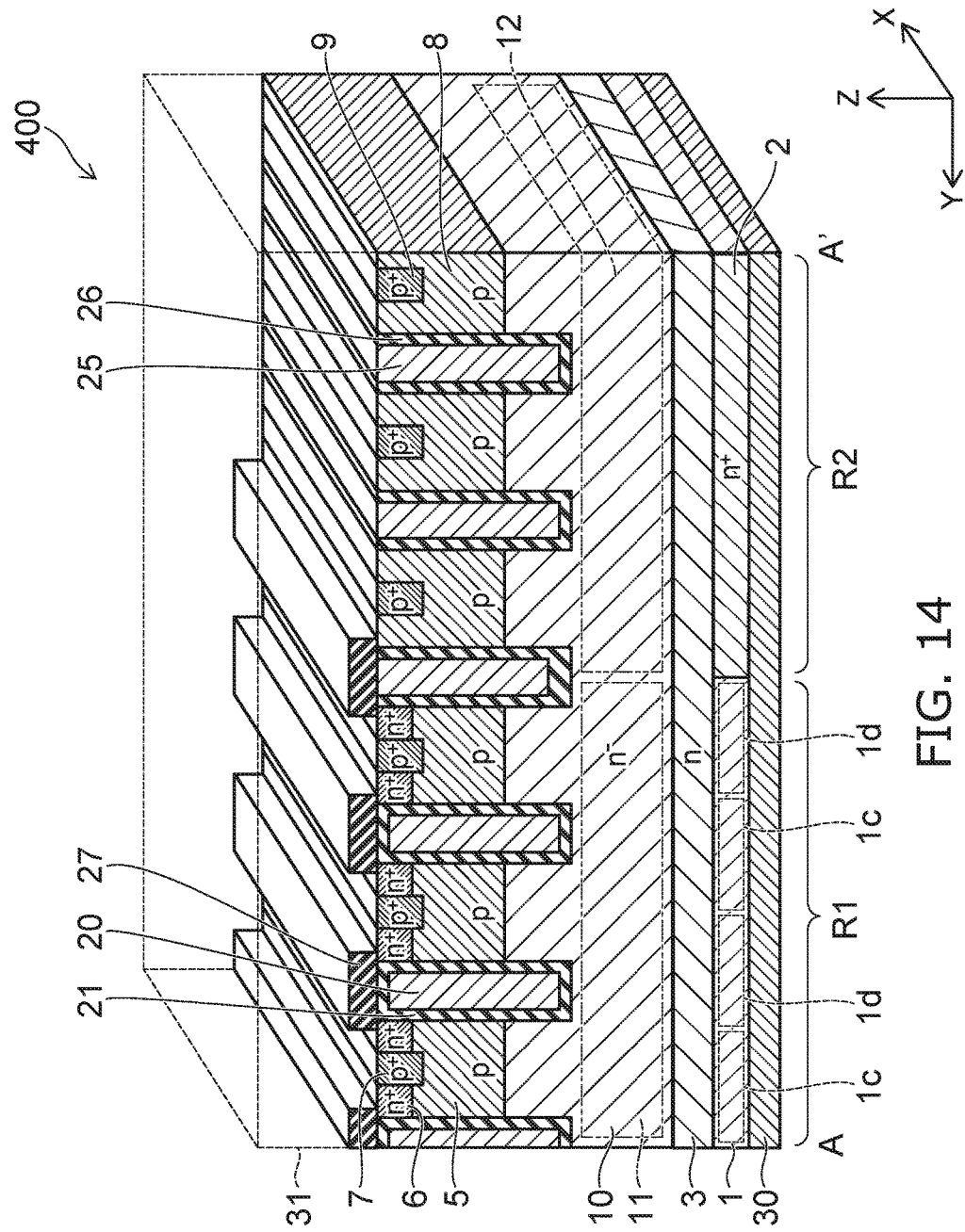
FIG. 14 is a perspective sectional view including an A-A' section of FIG. 13.

FIG. 14 is a perspective sectional view including an A-A' section of FIG. 13.

The semiconductor device 400 is different from the semiconductor device 100 in that a region where a concentration of a p-type impurity is relatively high and a region where a concentration of the p-type impurity is relatively low are provided in the p+-type collector region 1 in the IGBT region R1. Specifically, as shown in FIGS. 13 and 14, the p+-type collector region 1 includes a second portion 1b where a concentration of a p-type impurity is relatively high and a third portion 1c where a concentration of the p-type impurity is relatively low. For example, a plurality of second portions 1b is arranged in the X-direction and the Y-direction. The second portions 1b are side separated from each other. The third portion 1c is provided between the second portions 1b and around the plurality of second portions 1b.

According to the configuration, a p-type impurity concentration distribution may be formed in the p+-type collector region 1. Also in the variation, in the same manner as the second variation, an effective concentration of a p-type impurity in the lower surface of the IGBT region R1 can be decreased, and switching loss can be reduced. A current filament can move between the IGBT regions R1 through the p+-type semiconductor region 14. Therefore, a possibility that the semiconductor device 400 is destroyed can be decreased.

(Fourth Variation)

Figure 15:
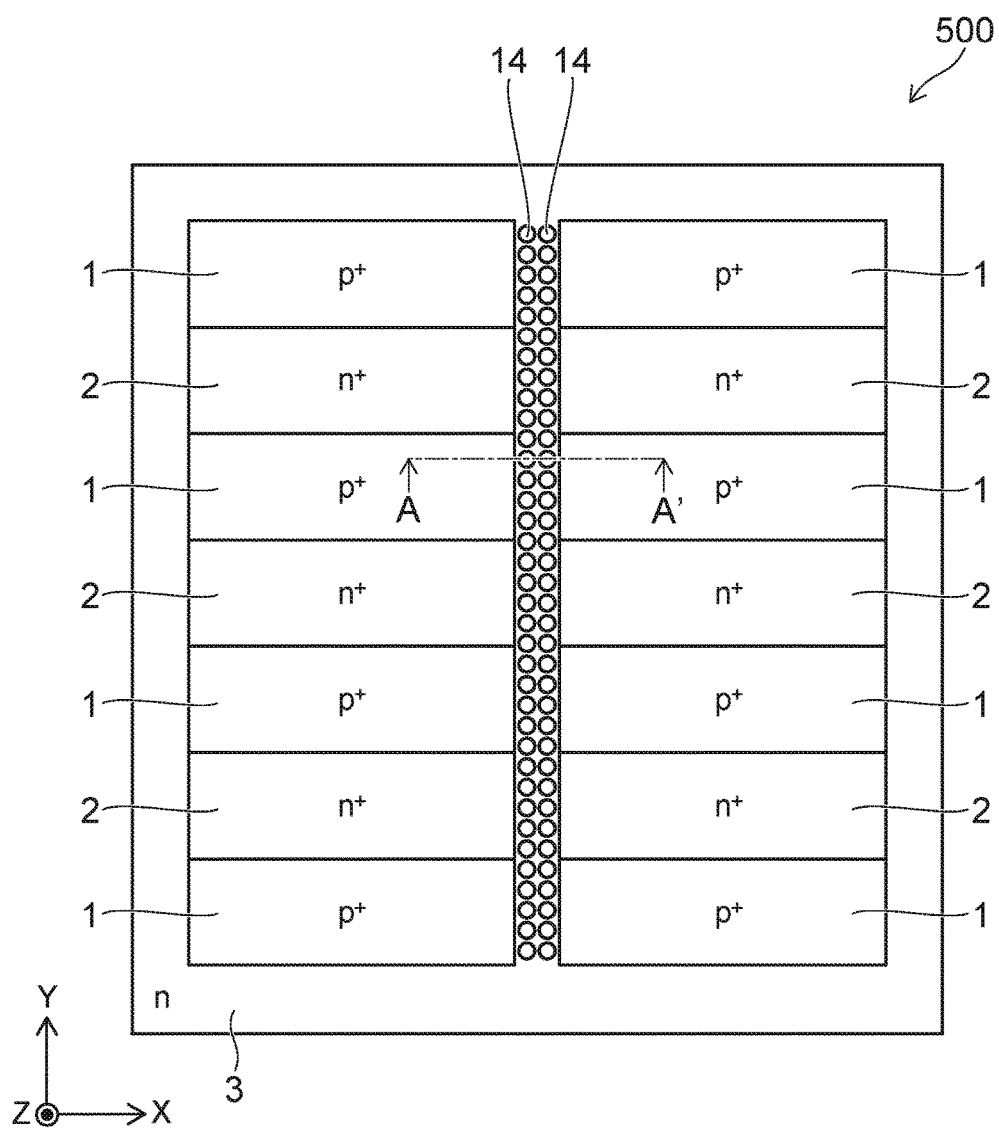
FIG. 15 is a plan view showing a structure of a lower surface of a semiconductor device according to a fourth variation of the embodiment.

FIG. 15 is a plan view showing a structure of a lower surface of a semiconductor device 500 according to a fourth variation of the embodiment.

Figure 16:
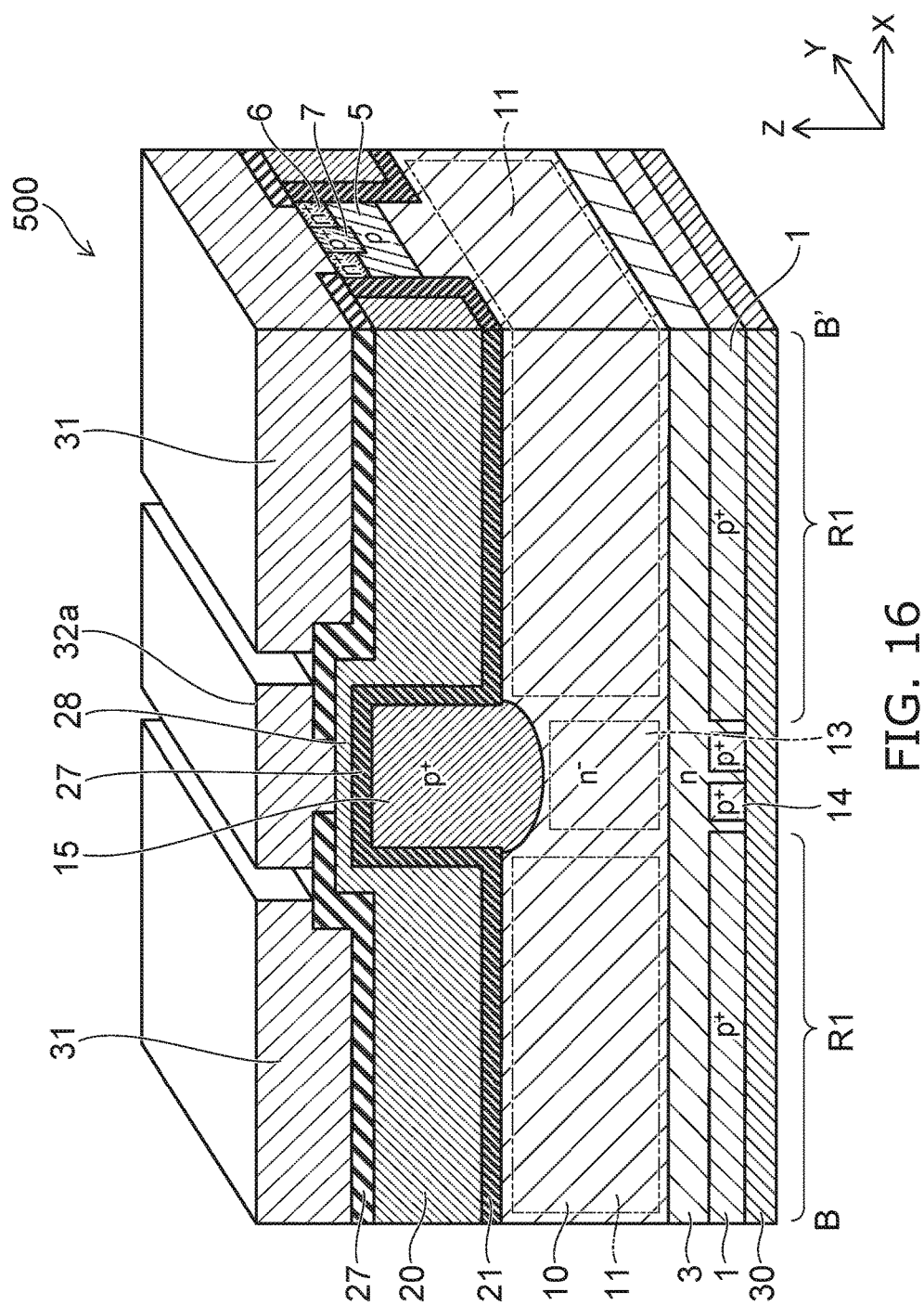
FIG. 16 is a perspective sectional view including an A-A' section of FIG. 15.

FIG. 16 is a perspective sectional view including an A-A' section of FIG. 15.

The semiconductor device 500 is different from the semiconductor device 100 in that a plurality of p+-type semiconductor regions 14 is provided in place of the p+-type semiconductor region 14 extending in the Y-direction. The plurality of p+-type semiconductor regions 14 is arranged along the Y-direction. The p+-type semiconductor regions 14 are separated from each other. A part of the plurality of p+-type semiconductor regions 14 is provided in the IGBT region R1 (between the p+-type collector regions 1) in the X-direction. Another part of the plurality of p+-type semiconductor regions 14 is provided in the FWD region R2 (between the n⁺-type cathode regions 2) in the X-direction.

A distance between the p⁺-type collector region 1 and the p⁺-type semiconductor region 14 which are the most contiguous to each other, and a distance between the p⁺-type semiconductor regions 14 are set so that a current filament can move between these regions. For example, each of these distances is smaller than a length in the X-direction or the Y-direction of the p⁺-type semiconductor region 14. Each of these distances is, for example, 10 µm or less.

In the same manner as the second variation and the third variation, switching loss of the semiconductor device 500 can be reduced by providing the plurality of p⁺-type semiconductor regions 14 separated from each other in place of the p⁺-type semiconductor region 14 extending in the Y-direction.

It is also possible to use the structure of the p⁺-type semiconductor region 14 according to the variation in combination with the structure of the IGBT region R1 shown in the second variation and the third variation. Switching loss of the semiconductor device 500 can be further reduced.

(Fifth Variation)

Figure 17:
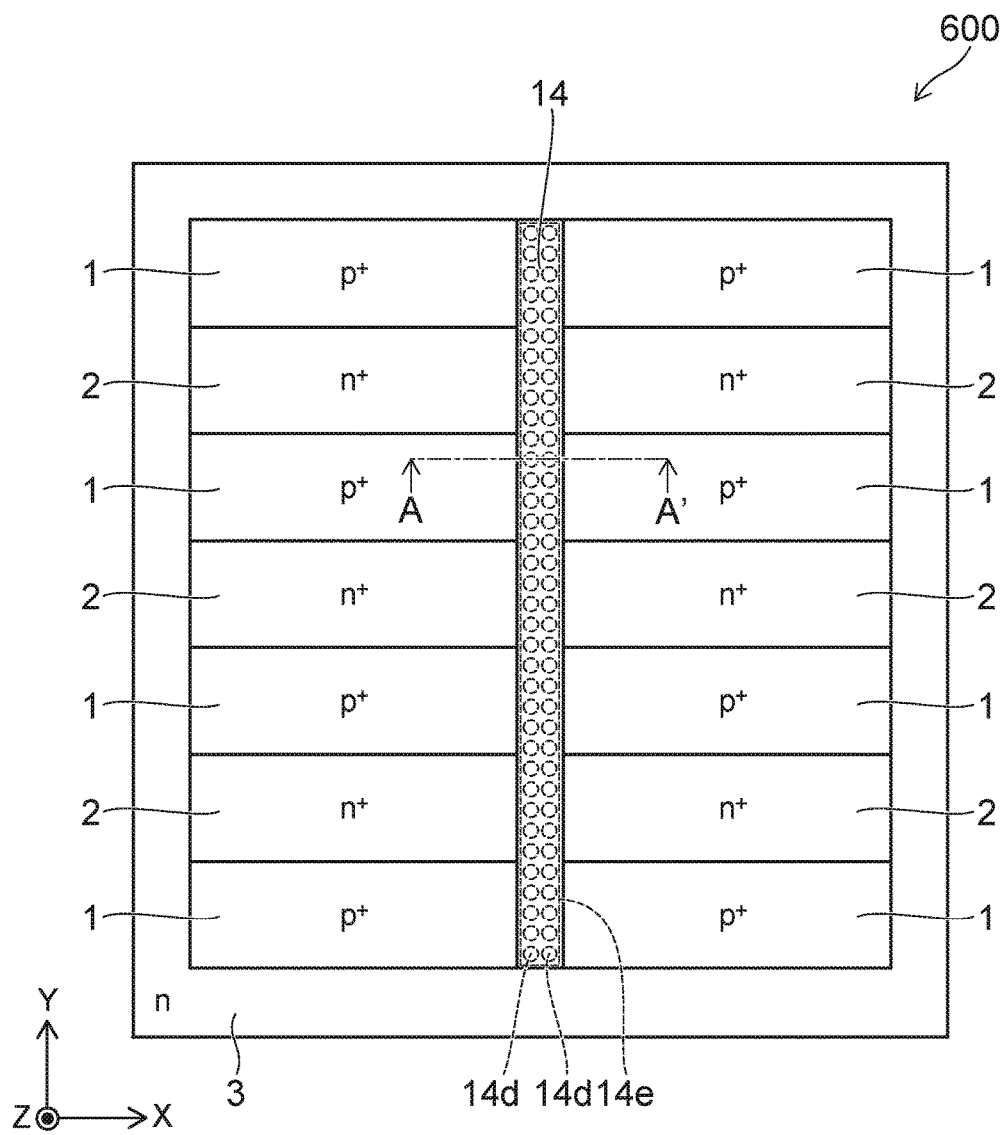
FIG. 17 is a plan view showing a structure of a lower surface of a semiconductor device according to a fifth variation of the embodiment.

FIG. 17 is a plan view showing a structure of a lower surface of a semiconductor device 600 according to a fifth variation of the embodiment.

Figure 18:
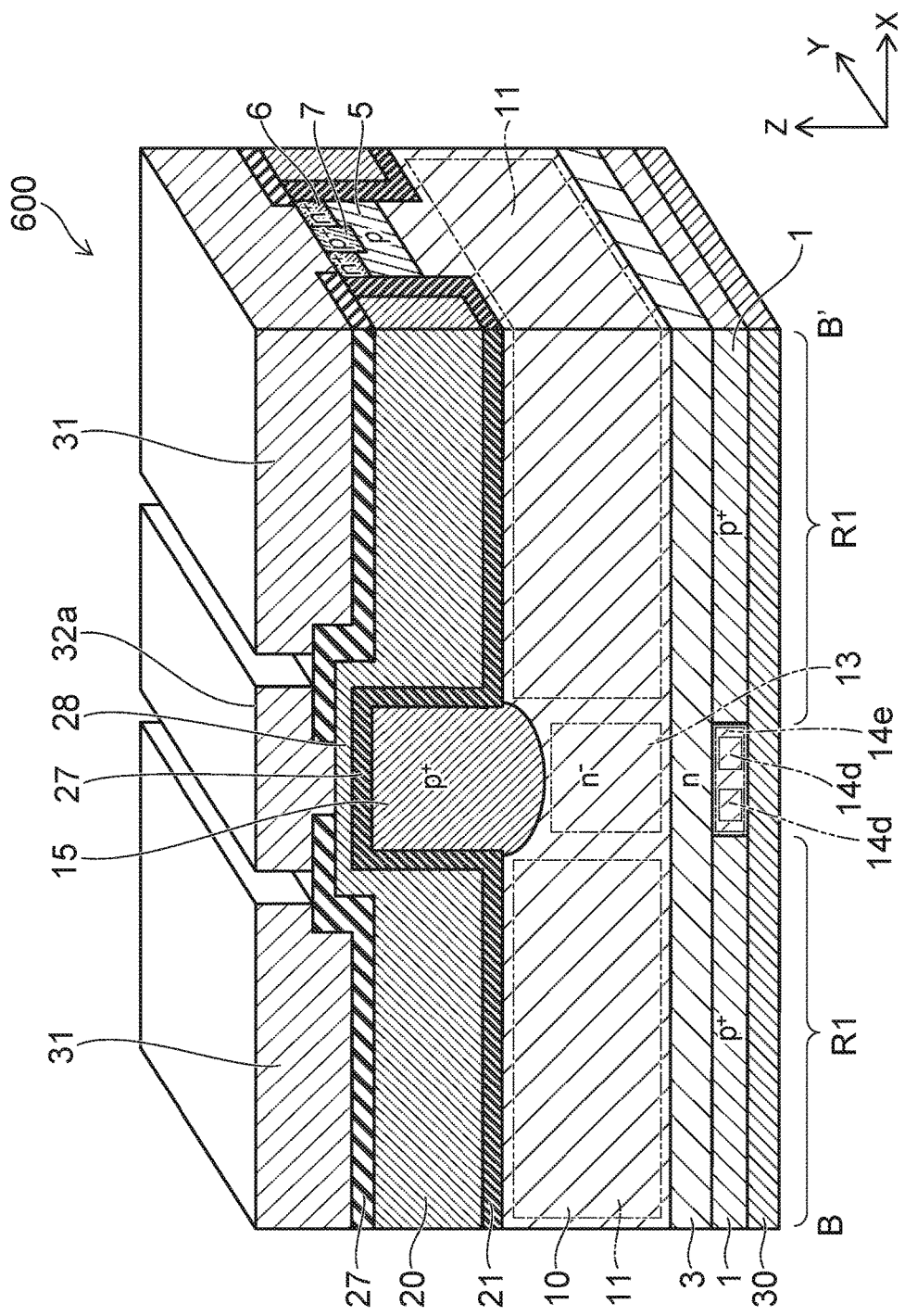
FIG. 18 is a perspective sectional view including an A-A' section of FIG. 17.

FIG. 18 is a perspective sectional view including an A-A' section of FIG. 17.

The semiconductor device 600 is different from the semiconductor device 100 in that the p⁺-type semiconductor region 14 includes a region where a concentration of a p-type impurity is high and a region where a concentration of the p-type impurity is low. Specifically, as shown in FIGS. 17 and 18, the p⁺-type semiconductor region 14 includes a fourth portion 14d and a fifth portion 14e. A concentration of a p-type impurity in the fourth portion 14d is relatively high. A concentration of the p-type impurity in the fifth portion 14e is relatively low. For example, a plurality of fourth portions 14d is arranged in the X-direction and in the Y-direction. The fourth portions 14d are separated from each other. The fifth portion 14e is provided between the fourth portions 14d and around the plurality of fourth portions 14d.

Also in the variation, in the same manner as the fourth variation, switching loss of the semiconductor device 500 can be reduced. It is also possible to use the structure of the p⁺-type semiconductor region 14 according to the variation in combination with the structure of the IGBT region R1 shown in the second variation and the third variation.

(Sixth Variation)

Figure 19:
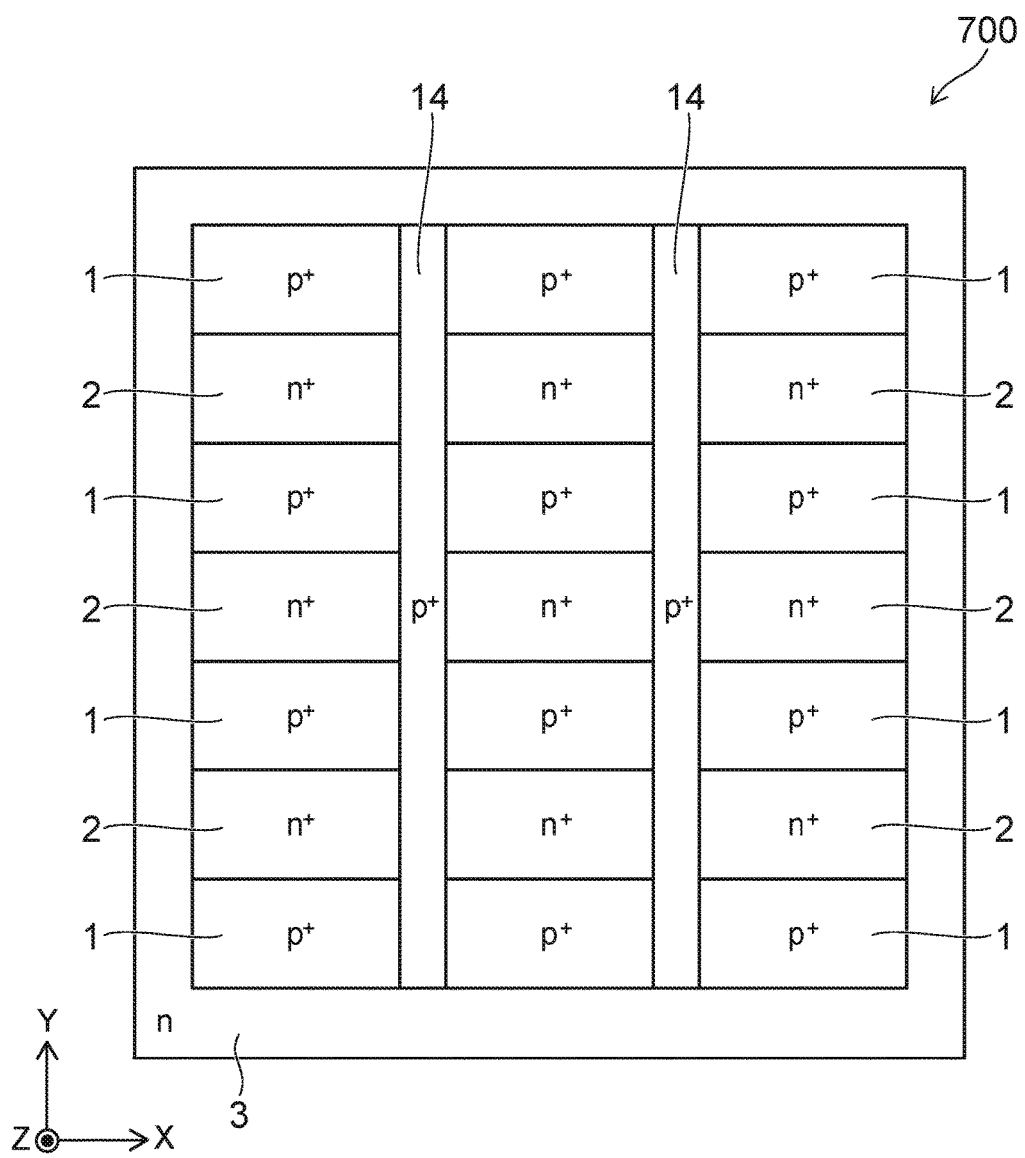
FIG. 19 is a plan view showing a structure of a lower surface of a semiconductor device according to a sixth variation of the embodiment.

FIG. 19 is a plan view showing a structure of a lower surface of a semiconductor device 700 according to a sixth variation of the embodiment.

The semiconductor device 700 is different from the semiconductor device 100 in that a plurality of p⁺-type semiconductor regions 14 is provided in the X-direction as shown in FIG. 19. Three or more IGBT regions R1 are arranged in the X-direction and three or more FWD regions R2 are arranged in the X-direction in the semiconductor device 700. The p⁺-type semiconductor region 14 is provided between the IGBT regions R1 adjacent to each other in the X-direction and between the FWD regions R2 adjacent to each other in the X-direction.

The p⁺-type semiconductor region 15 and the interconnect portion 32a are provided as shown in FIGS. 1, 3, and 4 on each p⁺-type semiconductor region 14.

A current filament can more easily move between the p⁺-type collector regions 1 by providing the plurality of p⁺-type semiconductor regions 14. Therefore, according to the variation, a possibility that the semiconductor device 700 is destroyed can be further decreased.

(Seventh Variation)

Figure 20:
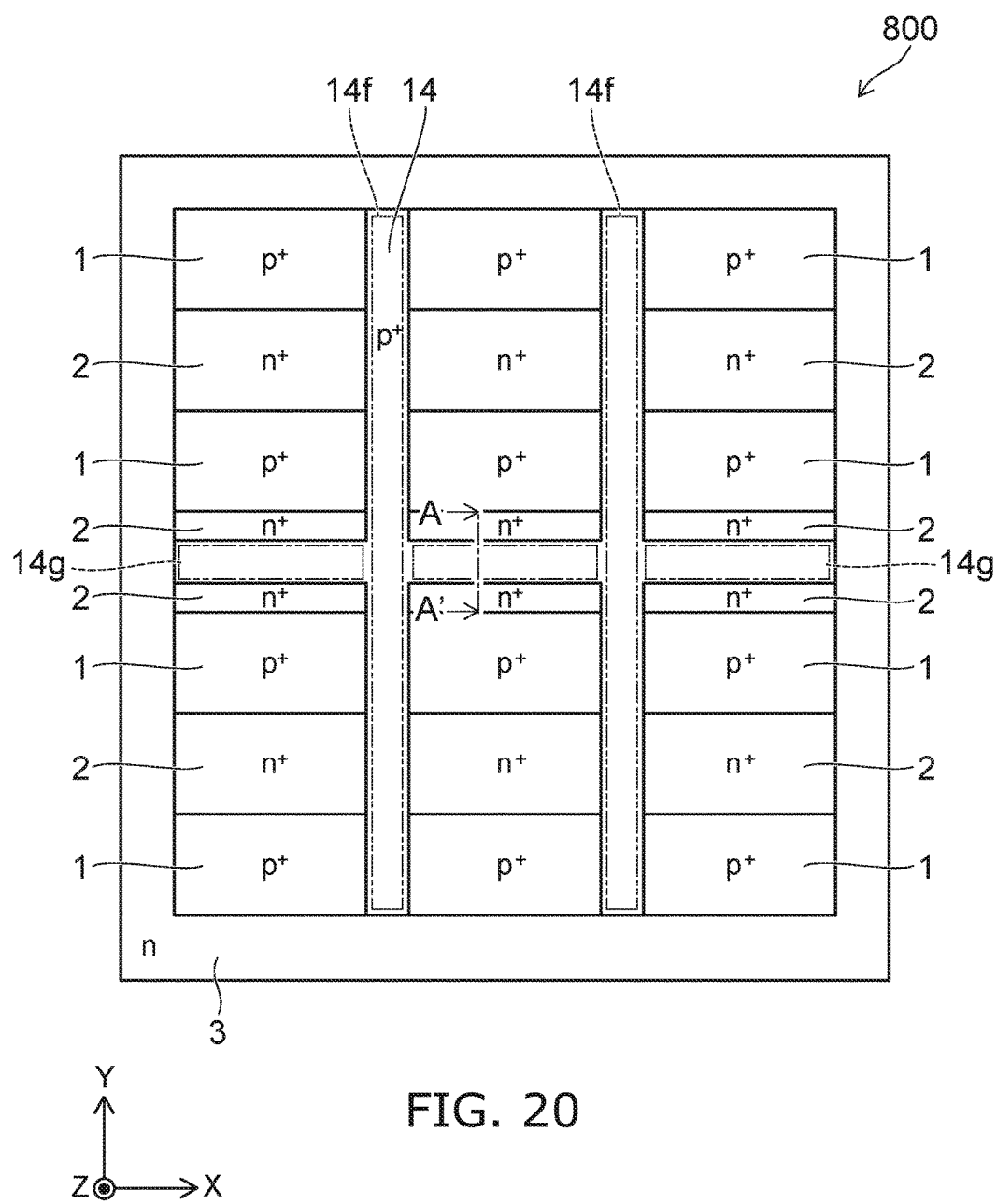
FIG. 20 is a plan view showing a structure of a lower surface of a semiconductor device according to a seventh variation of the embodiment.

FIG. 20 is a plan view showing a structure of a lower surface of a semiconductor device 800 according to a seventh variation of the embodiment.

Figure 21:
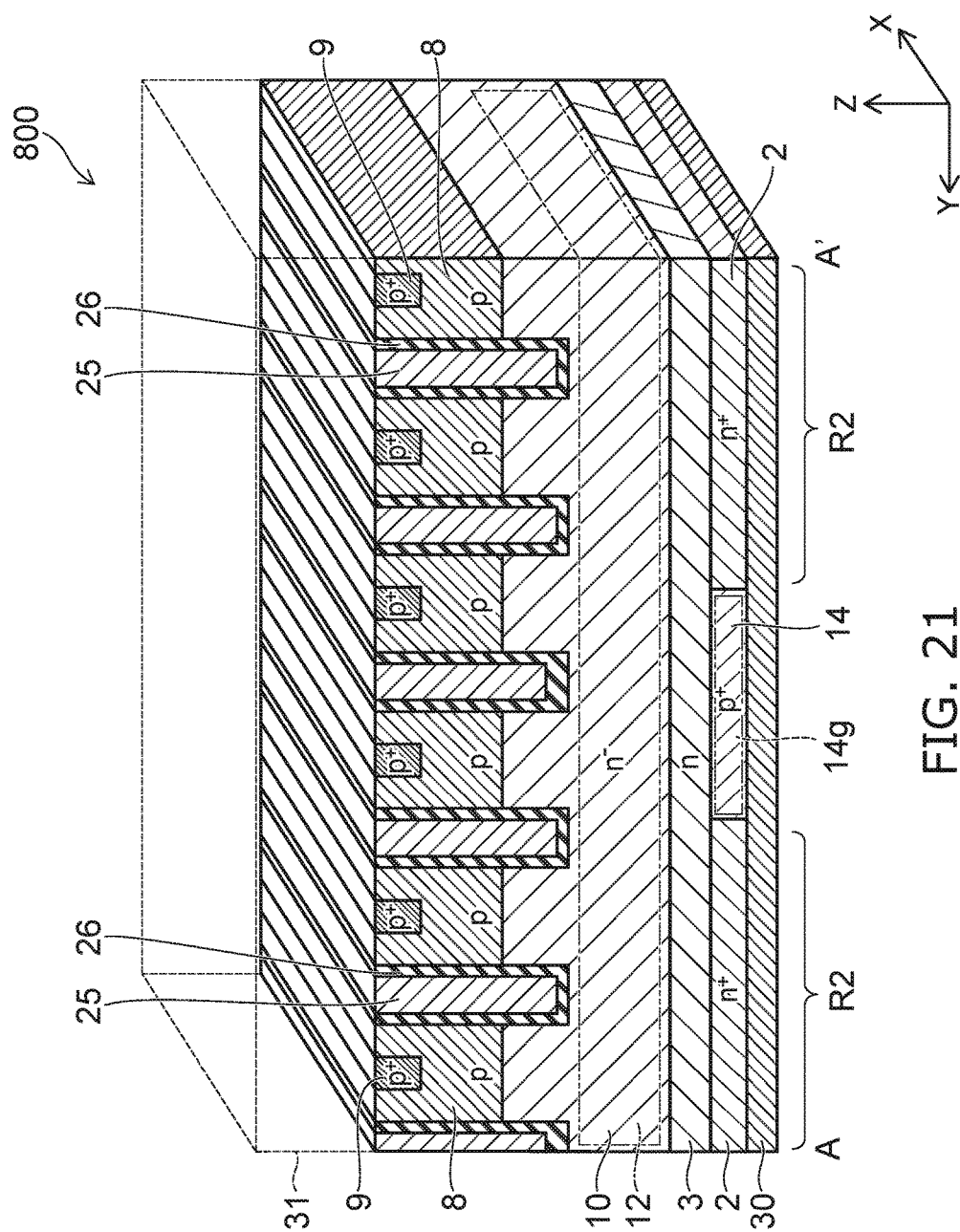
FIG. 21 is a perspective sectional view including an A-A' section of FIG. 20.

FIG. 21 is a perspective sectional view including an A-A' section of FIG. 20.

The semiconductor device 800 is different from the semiconductor device 100 in the structure of the p⁺-type semiconductor region 14. The p⁺-type semiconductor region 14 includes a sixth portion 14f and a seventh portion 14g. As shown in FIG. 21, the sixth portion 14f of the p⁺-type semiconductor region 14 extends in the Y-direction between the IGBT regions R1 and between the FWD regions R2. The seventh portion 14g of the p⁺-type semiconductor region 14 extends in the X-direction between the FWD regions R2.

As shown in FIG. 21, on the seventh portion 14g extending in the X-direction, the n-type semiconductor region 12 is provided, and thereon, the p-type anode region 8 and the field plate electrode 25 are provided. In other words, the p⁺-type semiconductor region 15 is not provided on the seventh portion 14g.

A region where a current filament can move can be made larger by including the sixth portion 14f and the seventh portion 14g in the p⁺-type semiconductor region 14. In particular, the current filament can move between the sixth portions 14f by connecting the sixth portions 14f to each other via the seventh portion 14g provided in the FWD region R2. Therefore, according to the variation, a possibility that the semiconductor device 800 is destroyed can be further decreased.

(Eighth Variation)

Figure 22:
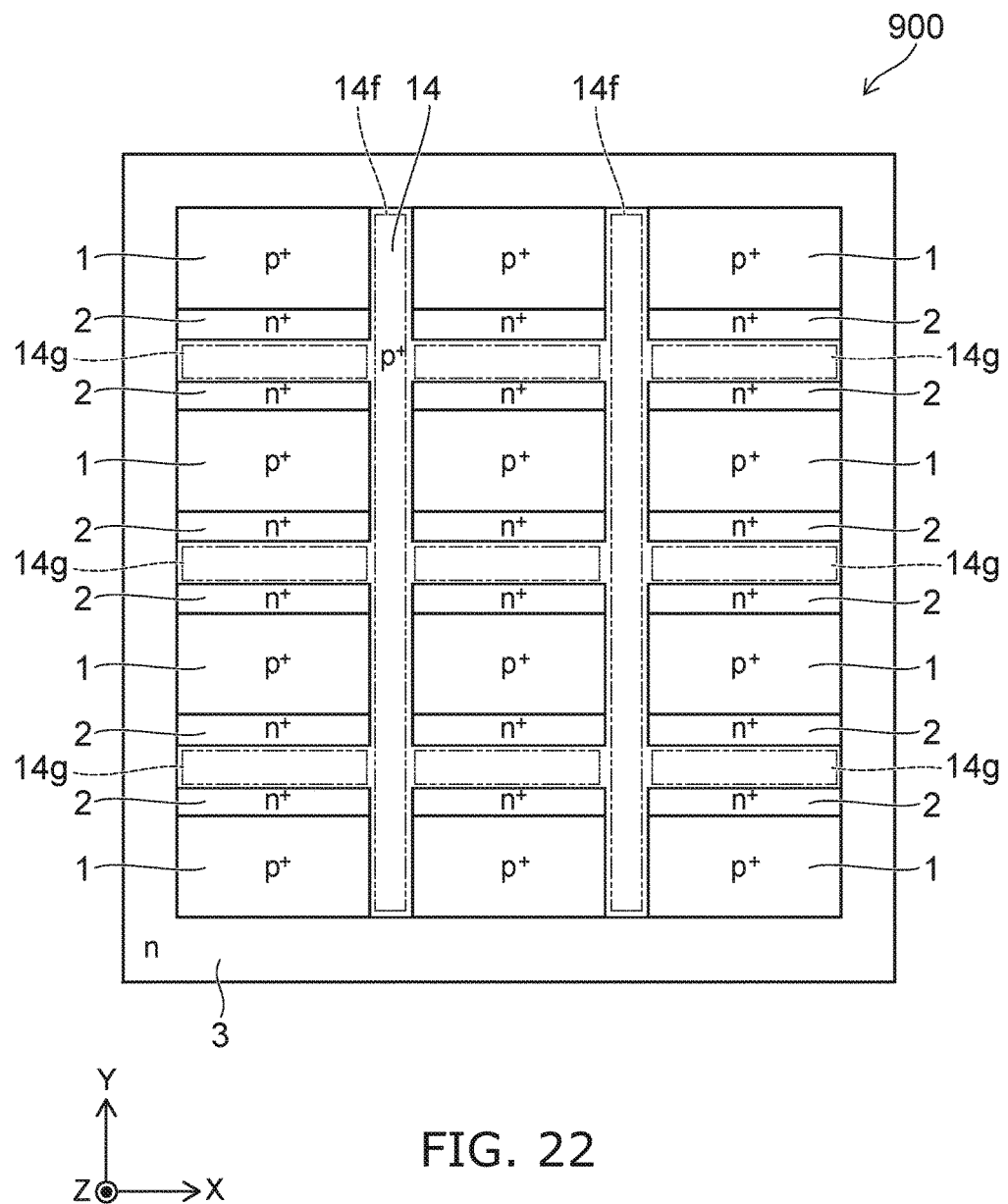
FIG. 22 is a plan view showing a structure of a lower surface of a semiconductor device according to an eighth variation of the embodiment.

FIG. 22 is a plan view showing a structure of a lower surface of a semiconductor device 900 according to an eighth variation of the embodiment.

The semiconductor device 900 is different from the semiconductor device 800 in that a plurality of seventh portions 14g of the p⁺-type semiconductor region 14 is provided in the X-direction. In this manner, the number of seventh portions 14g in the X-direction can be changed as appropriate. Also, the number of sixth portions 14f in the Y-direction is not limited to the example shown in FIGS. 20 and 22, and can be changed as appropriate.

It is also possible to appropriately combine the structure of the p⁺-type semiconductor region 14 according to the sixth variation to the eighth variation with the structure of the IGBT region R1 and the structure of the p⁺-type semiconductor region 14 according to the second variation to the fifth variation. By combining these, switching loss of the semiconductor device can be reduced.

The respective variations described above can be appropriately combined and carried out. For example, in the first variation to the eighth variation, as shown in FIG. 8, the p-type semiconductor region 16 may be provided around the p⁺-type collector region 1 and the p⁺-type semiconductor region 14.

It is possible to confirm the relative levels of the impurity concentrations of the semiconductor regions in the embodiments described above, for example, using a SCM (scanning capacitance microscope). The carrier concentrations of the semiconductor regions may be considered to be equal to the activated impurity concentrations of the semiconductor regions. Accordingly, the relative levels of the carrier concentrations of the semiconductor regions can be confirmed using SCM. It is possible to measure the impurity concentrations of the semiconductor regions, for example, using a SIMS (secondary ion mass spectrometer).

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention. Moreover, above-mentioned embodiments can be combined mutually and can be carried out.

What is claimed is:

1. A semiconductor device, comprising:
   a first electrode;
   a plurality of first regions, each of the first regions including:
      a first semiconductor region of a first conductivity type provided on the first electrode;
      a second semiconductor region of a second conductivity type provided on the first semiconductor region;
      a third semiconductor region of the first conductivity type provided on the second semiconductor region;
      a fourth semiconductor region of the second conductivity type provided on the third semiconductor region; and
      a gate electrode provided on the second semiconductor region, the gate electrode facing the third semiconductor region with a gate insulating layer interposed in a second direction, the second direction being perpendicular to a first direction directed from the first semiconductor region toward the second semiconductor region,
   the first regions being separated from each other in the second direction and a third direction, the third direction being perpendicular to the first direction and the second direction;
   a plurality of second regions, the second regions being separated from each other in the second direction and the third direction, the first regions and the second regions alternating in the second direction, each of the second regions including:
      a fifth semiconductor region of the second conductivity type provided on the first electrode;
      a sixth semiconductor region of the second conductivity type provided on the fifth semiconductor region; and
      a seventh semiconductor region of the first conductivity type provided on the sixth semiconductor region;
   an eighth semiconductor region of the first conductivity type, the eighth semiconductor region being provided between the first semiconductor regions and between the fifth semiconductor regions in the third direction, the eighth semiconductor region being electrically connected to the first semiconductor regions;
   a ninth semiconductor region of the second conductivity type provided on the eighth semiconductor region;
   a tenth semiconductor region of the first conductivity type provided on the ninth semiconductor region;
   a plurality of second electrodes provided on the third semiconductor regions, the fourth semiconductor regions, and the seventh semiconductor regions, the second electrodes being electrically connected to the fourth semiconductor regions and the seventh semiconductor regions; and
   a third electrode provided on the tenth semiconductor region with a first insulating layer interposed, the third electrode including an interconnect portion located between the second electrodes, the third electrode being separated from the second electrodes, the third electrode being electrically connected to the gate electrodes.

2. The device according to claim 1, wherein the tenth semiconductor region is electrically connected to the third semiconductor regions and the seventh semiconductor regions.

3. The device according to claim 1, wherein
   the eighth semiconductor region includes a first portion located between the fifth semiconductor regions in the third direction, and
   a length in the third direction of the first portion is 200 μm or more.

4. The device according to claim 1, wherein
   the eighth semiconductor region is multiply provided in the third direction,
   each of the eighth semiconductor region is provided between the first semiconductor regions adjacent to each other in the third direction and between the fifth semiconductor regions adjacent to each other in the third direction.

5. The device according to claim 1, wherein
   a part of the eighth semiconductor region extends along the third direction in the second region, and
   the part of the eighth semiconductor region is provided between the fifth semiconductor regions in the second direction.

6. The device according to claim 1, wherein a carrier concentration of the first conductivity type in the tenth semiconductor region is higher than a carrier concentration of the first conductivity type in the third semiconductor region, and higher than a carrier concentration of the first conductivity type in the seventh semiconductor region.

7. The device according to claim 1, wherein a length in the first direction of the tenth semiconductor region is larger than a length in the first direction of the gate electrode, and larger than a length in the first direction of the fourth electrode.

8. The device according to claim 1, wherein a carrier concentration of the second conductivity type in the fifth semiconductor region is higher than a carrier concentration of the second conductivity type in the sixth semiconductor region.

9. The device according to claim 1, wherein a carrier concentration of the second conductivity type in the fourth semiconductor region is higher than a carrier concentration of the second conductivity type in the second semiconductor region.

10. The device according to claim 1, wherein a carrier concentration of the first conductivity type in the first semiconductor region is higher than a carrier concentration of the first conductivity type in the third semiconductor region.

11. The device according to claim 1, wherein a carrier concentration of the first conductivity type in the eighth semiconductor region is equal to a carrier concentration of the first conductivity type in the first semiconductor region.

12. The device according to claim 1, further comprising an eleventh semiconductor region of the first conductivity type provided on the third semiconductor region, a carrier concentration of the first conductivity type in the eleventh semiconductor region is higher than a carrier concentration of the first conductivity type in the third semiconductor region.

13. The device according to claim 1, further comprising a twelfth semiconductor region of the first conductivity type provided on the seventh semiconductor region, a carrier concentration of the first conductivity type in the twelfth semiconductor region is higher than a carrier concentration of the first conductivity type in the seventh semiconductor region.

14. The device according to claim 1, wherein
each of the first regions operates as an IGBT, and
each of the second regions operates as a diode.

15. A semiconductor device, comprising:
a first electrode;
a plurality of first regions, each of the first regions including:
    a plurality of first semiconductor regions of a first conductivity type provided on the first electrode, the first semiconductor regions being separated from each other;
    a second semiconductor region of a second conductivity type provided on the first semiconductor regions;
    a third semiconductor region of the first conductivity type provided on the second semiconductor region;
    a fourth semiconductor region of the second conductivity type provided on the third semiconductor region; and
    a gate electrode provided on the second semiconductor region, the gate electrode facing the third semiconductor region with a gate insulating layer interposed,
the first regions being separated from each other in a second direction and a third direction, the second direction being perpendicular to a first direction directed from the first semiconductor regions to the second semiconductor region, the third direction being perpendicular to the first direction and the second direction;

a plurality of second regions separated from each other in the second direction and the third direction, each of the second regions including:
    a fifth semiconductor region of the second conductivity type provided on the first electrode;
    a sixth semiconductor region of the second conductivity type provided on the fifth semiconductor region; and
    a seventh semiconductor region of the first conductivity type provided on the sixth semiconductor region;
the first regions and the second regions alternating in the second direction;
a plurality of eighth semiconductor regions of the first conductivity type provided between the first regions and between the fifth semiconductor regions in the third direction, the eighth semiconductor regions being separated from each other; and
a second electrode provided on the third semiconductor regions, the fourth semiconductor regions, and the seventh semiconductor regions, the second electrode being electrically connected to the fourth semiconductor regions and the seventh semiconductor regions.

* * * * *